(12) United States Patent
Yamamoto

(10) Patent No.: US 7,905,668 B2
(45) Date of Patent: Mar. 15, 2011

(54) COATING/DEVELOPING APPARATUS AND METHOD

(75) Inventor: Masahiro Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 159 days.

(21) Appl. No.: 12/392,338

(22) Filed: Feb. 25, 2009

(65) Prior Publication Data
US 2009/0291399 A1 Nov. 26, 2009

(30) Foreign Application Priority Data
May 22, 2008 (JP) ................................. 2008-134684

(51) Int. Cl.
*G03D 5/00* (2006.01)
*G03B 27/32* (2006.01)
(52) U.S. Cl. ......................................... 396/578; 396/611
(58) Field of Classification Search .................. 396/570, 396/578, 611
See application file for complete search history.

(56) References Cited

U.S. PATENT DOCUMENTS
7,780,366 B2 * 8/2010 Ogata et al. ................... 396/578

FOREIGN PATENT DOCUMENTS
JP 2002-260994 9/2002
* cited by examiner

*Primary Examiner* — W. B. Perkey
(74) *Attorney, Agent, or Firm* — Oblon, Spivak, McClelland, Maier & Neustadt, L.L.P.

(57) ABSTRACT

A coating/developing apparatus includes a first storage section that stores data comprising correlations of different pattern information units including at least a line width of the resist pattern, different values of a film thickness of the underlying film, and different light information profiles. The apparatus further includes a mechanism configured to use a film thickness distribution to obtain an estimated film thickness of the underlying film at a light-irradiation area on the surface of the substrate, and to check the estimated film thickness and a light information profile obtained at the light-irradiation area against the data to determine pattern information at the light-irradiation area.

19 Claims, 21 Drawing Sheets

COATING/DEVELOPING APPARATUS AND METHOD

BACKGROUND OF THE INVENTION

1. Field of the Invention

The present invention relates to a coating/developing apparatus and method for performing a coating process of a resist liquid on a substrate, such as a semiconductor wafer or an LCD substrate (a glass substrate for liquid crystal displays), and a developing process subsequent to light exposure. The present invention also relates to a storage medium that stores a program for executing the method.

2. Description of the Related Art

In the process of manufacturing semiconductor devices, there is used a system including a coating/developing apparatus for performing coating and development of a resist liquid and a light exposure apparatus connected to the coating/developing apparatus. According to this system, a series of processes are performed on a substrate, such as a semiconductor wafer or LCD substrate, to form a predetermined resist pattern, wherein a resist liquid is applied to the substrate, and the resist film thus formed is subjected to light exposure using a photo mask and subsequent development.

The coating/developing apparatus includes a carrier block, a process block, and an interface block connected to a light exposure apparatus, which are arrayed in a row. The carrier block is structured to place wafer carriers thereon and includes a transfer arm configured to transfer semiconductor wafers (which may be simply referred to as wafers) to and from the wafer carriers. The process block is configured to form films on a wafer, such as a resist film and an anti-reflection film below the resist film, and to perform a developing process to form a resist pattern.

Each of wafers with a resist pattern formed thereon is subjected to examinations in terms of, e.g., the resist film thickness, the line width (CD) of recessed portions forming the resist pattern, the width (pitch) of a pair of recessed and protruded portions adjacent to each other in the resist pattern, and so forth. Then, only wafers judged as being acceptable are sent to subsequent steps. These examinations may be performed by stand-alone examination apparatuses disposed independently of the coating/developing apparatus, or performed by examination modules disposed inside the coating/developing apparatus.

A method using a technique called scatterometry may be used for these examinations, because of advantages in that this method can be performed under atmospheric environment and can provide a relatively short measurement time. This examination method will be explained with reference to FIGS. 19 and 20. Films and so forth to be formed on a wafer W are designed with various values of dimensions in advance, in terms of, e.g., the line width of a resist pattern, the resist film thickness, and the anti-reflection film thickness below the resist film. Wafers W are respectively prepared in accordance with the various values of film thickness and pattern line width thus designed. A portion including the resist pattern on each of the wafers W is irradiated with light emitted from a light radiating portion 1A of an examination apparatus (examination module). Further, light reflected from the light-irradiation area on the surface of the wafer W is received by a light receiving portion 1B of the examination apparatus. Then, a light information profile is formed to represent the relationship between the light thus received and information included in the light.

For example, information included in light comprises the reflection coefficient (R) and polarized light components (Δ, Ψ). However, the following explanation will be given by taking the reflection coefficient as a representative of the information. The reflection coefficient is expressed by the ratio (IR/II) of the intensity IR of light radiated onto a wafer W relative to the intensity II of light reflected from the wafer W. This light information profile can be obtained by a simulation or by an actual measurement of the shapes and optical constants ("n" value, "k" value, and so forth) of films on a wafer W with a resist pattern 11 formed thereon. Each of the light information profiles thus obtained is set correlated with data concerning the anti-reflection film thickness, resist film thickness, and pattern information comprising at least the line width of the resist pattern on the wafer W from which the light information profile has been obtained. The wafer data thus formed is stored in a storage section 1C of a computer.

When a wafer W is examined in the examination apparatus, the area including the resist pattern 11 on the wafer W is irradiated with light from the light radiating portion 1A. Further, light reflected from the wafer W is received by the light receiving portion 1B. Based on the reflected light thus received, a light information profile 1D is obtained. Then, data of a wafer including a light information profile that approximates or conforms to this light information profile 1D is retrieved from data of wafers W stored in the storage section 1C. Then, the pattern information, resist film thickness, and anti-reflection film thickness of the retrieved wafer data are read out from the storage section 1C. Based on the information thus read out, the line width of the resist pattern, the anti-reflection film thickness, and the resist film thickness are determined for the wafer W treated as an examination target.

Incidentally, as shown in FIG. 21, with a decreased in the size of semiconductor devices, the thickness of a resist film 11 and the thickness of an anti-reflection film 12 formed on a wafer W are becoming smaller. Where the film thickness is smaller, light radiated on a wafer W is not sufficiently refracted or absorbed in the resist film, and so the information amount obtained by the light receiving portion 1B is decreased. As a result, the examination accuracy is deteriorated, and the difference between resist pattern information obtained by the examination and the actual resist pattern becomes larger. A decreased in examination accuracy is caused not only by a decrease in light scattering but also by similarity of optical properties of the anti-reflection film, such as the "n" and "k" values, relative to those of the resist film. Under the circumstances, studies have been made to improve the examination accuracy.

In light of this, studies have been made such that, when an obtained light information profile 1D is checked against the storage section 1C, a design value (target value) is used for the thickness of an anti-reflection film to be formed on a wafer W. Specifically, for example, a coating/developing apparatus includes portions designed to form an anti-reflection film having a thickness of 90 nm on a wafer W, and the examination described above is performed on the wafer W after resist pattern formation. In this case, it is preset (fixed) that data of wafers with an anti-reflection film thickness of 90 nm is to be selected from the storage section 1C when the storage section 1C is searched for the light information profile 1D of the examination target wafer W. After the light information profile 1D is obtained, selection is made from data of wafers with an anti-reflection film thickness of 90 nm, such that data of a wafer including a light information profile that conforms or approximates to the light information profile 1D is selected, and the resist pattern information is read out from the selected wafer data.

However, the anti-reflection film thickness distribution on the surface of a wafer W can fluctuate depending on various film formation conditions used for forming the anti-reflection film, and thus the film thickness may have a poor planar uniformity. Accordingly, where the checking operation described above is performed while the anti-reflection film thickness is fixed to a design value, the design value may include an error relative to the actual value of the anti-reflection film thickness at an area irradiated with light for forming the light information profile 1D. Due to the error in film thickness, pattern information determined by the checking operation comes to also include an error relative to that of the actual resist pattern, and so the examination accuracy cannot be sufficiently improved.

Further, in place of the anti-reflection film thickness, the resist film thickness may be fixed to a design value when the light information profile 1D is checked against the storage section 1C. However, also in this case, an error may be caused due to its film thickness distribution, as in the case where the anti-reflection film thickness is fixed to a design value.

Alternatively, after the resist pattern formation, irradiation with light from the light radiating portion 1A may be applied to an area (underlying film portion) where an anti-reflection film is exposed around the area where the resist pattern is formed on the surface of a wafer W, so that this alternative area is examined as in the examination of a resist pattern and the anti-reflection film thickness is thereby measured. In this case, the underlying film portion is measured to examine the anti-reflection film thickness, and then the resist pattern formation area adjacent thereto is examined to form a light information profile 1D. Thereafter, when the light information profile 1D is checked against the storage section 1C, the obtained information about the anti-reflection film thickness is utilized to improve the measure accuracy. However, in this case, an examination of an area with a pattern formed therein is accompanied by an examination of an underlying film portion around it to measure the anti-reflection film thickness, and so the number of measurement points is increased and the throughput is thereby deteriorated.

Jpn. Pat. Appln. KOKAI Publication No. 2002-260994 (paragraph 0030 and so forth) discloses a method for examining a pattern by use of scatterometry. However, this document discloses no mechanism for solving the problem described above about a decrease in the measure accuracy.

BRIEF SUMMARY OF THE INVENTION

An object of the present invention is to provide a coating/developing apparatus and method which can improve the accuracy of pattern information including at least the line width of a resist pattern, and to further provide a storage medium that stores a program for executing the method. The pattern information is obtained based on a light information profile representing the relationship between the wavelength of a reflected light and information included in the light where light is radiated onto the surface of a substrate including the resist pattern formed thereon and light reflected from the substrate is measured.

According to a first aspect of the present invention, there is provided a coating/developing apparatus for laminating a resist film on an underlying film formed on a surface of a substrate and developing the resist film treated by light exposure to form a resist pattern, the apparatus comprising: an underlying film formation module configured to supply a chemical liquid onto the substrate to form a coating film as the underlying film; a mechanism configured to obtain a film thickness distribution of the underlying film on the surface of the substrate in accordance with a process parameter used for forming the underlying film; a light radiating portion configured to radiate light onto the surface of the substrate with the resist pattern formed thereon; a light receiving portion configured to receive light reflected from the surface of the substrate; a mechanism configured to obtain a light information profile representing a relationship concerning the light received by the light receiving portion between its wavelength and information included therein; a first storage section that stores data comprising correlations of different pattern information units including at least a line width of the resist pattern, different values of a film thickness of the underlying film, and different light information profiles; and a mechanism configured to use the film thickness distribution to obtain an estimated film thickness of the underlying film at a light-irradiation area on the surface of the substrate, and to check the estimated film thickness and a light information profile obtained at the light-irradiation area against the data to determine pattern information at the light-irradiation area.

In the first aspect, the mechanism configured to obtain a film thickness distribution of the underlying film may comprise a second storage section that stores data comprising correlations of different values of the process parameter and different film thickness distributions, and may be configured to check a given value of the process parameter against the data stored in the second storage section to obtain the film thickness distribution. Alternatively, the mechanism configured to obtain a film thickness distribution of the underlying film may be configured to perform arithmetical operations using a given value of the process parameter to obtain the film thickness distribution.

The underlying film formation module may comprise a chemical liquid nozzle configured to supply the chemical liquid onto a central portion of the substrate, and a holding member configured to hold a back side central portion of the substrate and to rotate the substrate about a vertical axis so as to spread the chemical liquid from the central portion of the substrate to a peripheral portion by a centrifugal force, and the process parameter may include a rotational speed of the substrate in performing supply of the chemical liquid from the chemical liquid nozzle and a rotational speed of the substrate for drying the chemical liquid after the supply of the chemical liquid is stopped. The underlying film may comprise an anti-reflection film. The light information profile may comprise a relationship between a light wavelength and a reflection coefficient or polarized light component.

According to a second aspect of the present invention, there is provided a coating/developing apparatus for laminating a resist on a surface of a substrate and developing the resist film treated by light exposure to form a resist pattern, the apparatus comprising: a resist film formation module configured to supply a resist onto the substrate to form a coating film as the resist film; a mechanism configured to obtain a film thickness distribution of the resist film on the surface of the substrate in accordance with a process parameter used for forming the resist film; a light radiating portion configured to radiate light onto the surface of the substrate with the resist pattern formed thereon; a light receiving portion configured to receive light reflected from the surface of the substrate; a mechanism configured to obtain a light information profile representing a relationship concerning the light received by the light receiving portion between its wavelength and information included therein; a first storage section that stores data comprising different pattern information units including at least a line width of the resist pattern, different values of a film thickness of the resist film, and different light information profiles; and a mechanism configured to use the film thickness distribution to obtain an estimated film thickness of the resist film at a light-irradiation area on the surface of the substrate, and to check the estimated film thickness and a light information profile obtained at the light-irradiation area against the data to determine pattern information at the light-irradiation area.

In the second aspect, the mechanism configured to obtain a film thickness distribution of the resist film may comprise a second storage section that stores data comprising correlations of different values of the process parameter and different film thickness distributions, and may be configured to check a given value of the process parameter against the data stored in the second storage section to obtain the film thickness distribution. Alternatively, the mechanism configured to obtain a film thickness distribution of the resist film may be configured to perform arithmetical operations using a given value of the process parameter to obtain the film thickness distribution.

The film thickness distribution of the resist film may comprise a film thickness distribution of the resist film after a developing process is performed thereon. The light information profile may comprise a relationship between a light wavelength and a reflection coefficient or polarized light component.

According to a third aspect of the present invention, there is provided a coating/developing method for laminating a resist film on an underlying film formed on a surface of a substrate and developing the resist film treated by light exposure to form a resist pattern, the method comprising: supplying a chemical liquid onto the substrate to form a coating film as the underlying film; obtaining a film thickness distribution of the underlying film on the surface of the substrate in accordance with a process parameter used for forming the underlying film; radiating light onto the surface of the substrate with the resist pattern formed thereon; receiving light reflected from the surface of the substrate; obtaining a light information profile representing a relationship concerning the light thus received between its wavelength and information included therein; using the film thickness distribution to obtain an estimated film thickness of the underlying film at a light-irradiation area on the surface of the substrate; and checking the estimated film thickness and a light information profile obtained at the light-irradiation area against data comprising correlations of different pattern information units including at least a line width of the resist pattern, different values of a film thickness of the underlying film, and different light information profiles, to determine pattern information at the light-irradiation area.

In the third aspect, said obtaining a film thickness distribution of the underlying film may comprise checking a given value of the process parameter against data comprising correlations of different values of the process parameter and different film thickness distributions. Alternatively, said obtaining a film thickness distribution of the underlying film may comprise performing arithmetical operations using a given value of the process parameter to obtain the film thickness distribution.

According to a fourth aspect of the present invention, there is provided a coating/developing method for laminating a resist film on a surface of a substrate and developing the resist film treated by light exposure to form a resist pattern, the method comprising: supplying a resist onto the substrate to form a coating film as the resist film; obtaining a film thickness distribution of the resist film on the surface of the substrate in accordance with a process parameter used for forming the resist film; radiating light onto the surface of the substrate with the resist pattern formed thereon; receiving light reflected from the surface of the substrate; obtaining a light information profile representing a relationship concerning the light thus received between its wavelength and information included therein; using the film thickness distribution to obtain an estimated film thickness of the resist film at a light-irradiation area on the surface of the substrate; and checking the estimated film thickness and a light information profile obtained at the light-irradiation area against data comprising correlations of different pattern information units including at least a line width of the resist pattern, different values of a film thickness of the resist film, and different light information profiles, to determine pattern information at the light-irradiation area.

In the fourth aspect, said obtaining a film thickness distribution of the resist film may comprise checking a given value of the process parameter against data comprising correlations of different values of the process parameter and different film thickness distributions. Alternatively, said obtaining a film thickness distribution of the resist film may comprise performing arithmetical operations using a given value of the process parameter to obtain the film thickness distribution.

According to a fifth aspect of the present invention, there is provided a computer readable medium containing program instructions for execution on a processor for performing the coating/developing method according to the third or fourth aspect, wherein the program instructions, when executed by the processor, cause a coating/developing apparatus to perform the coating/developing method according to the third or fourth aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described in detail with reference to the accompanying drawings.

First Embodiment

Figure 1:
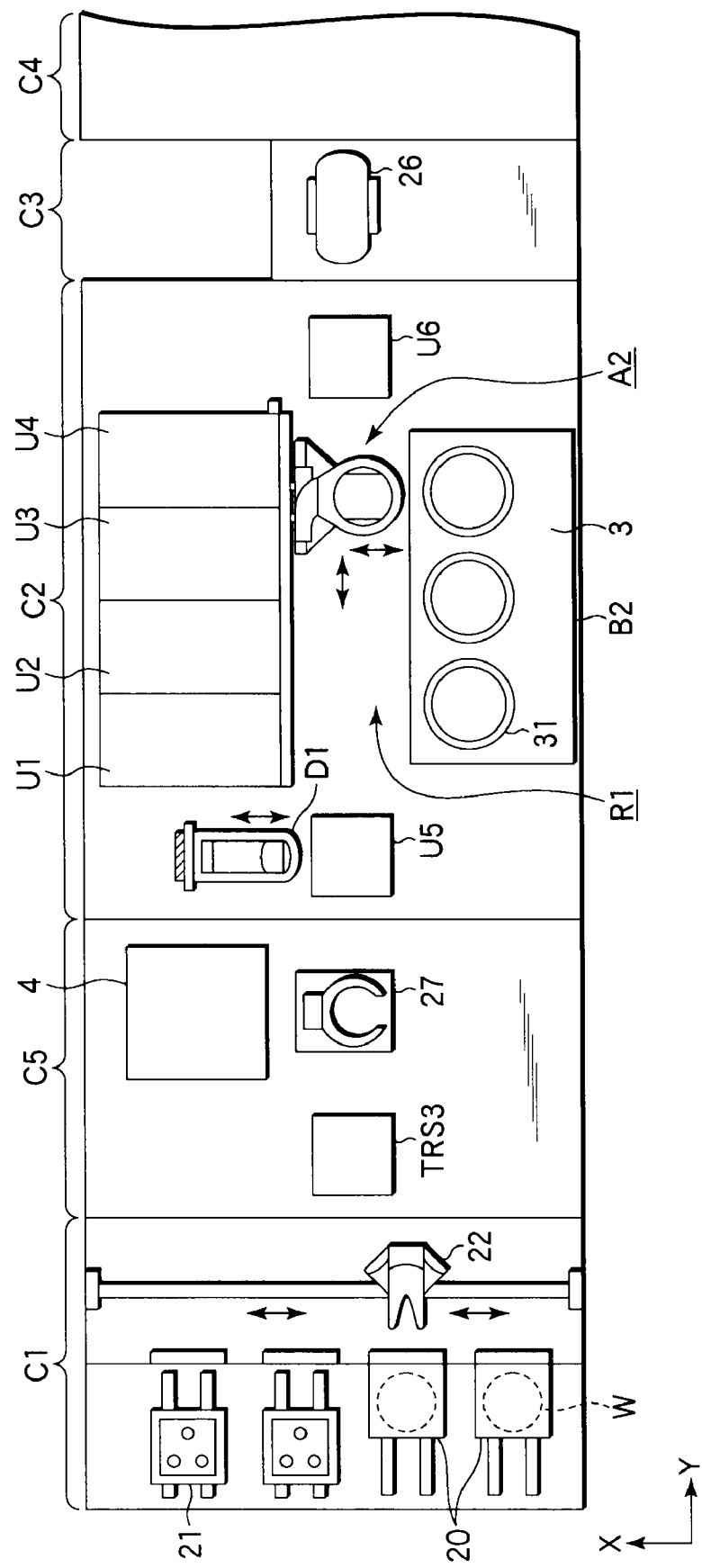
FIG. 1 is a sectional plan view showing a coating/developing apparatus according to an embodiment of the present invention.
Figure 2:
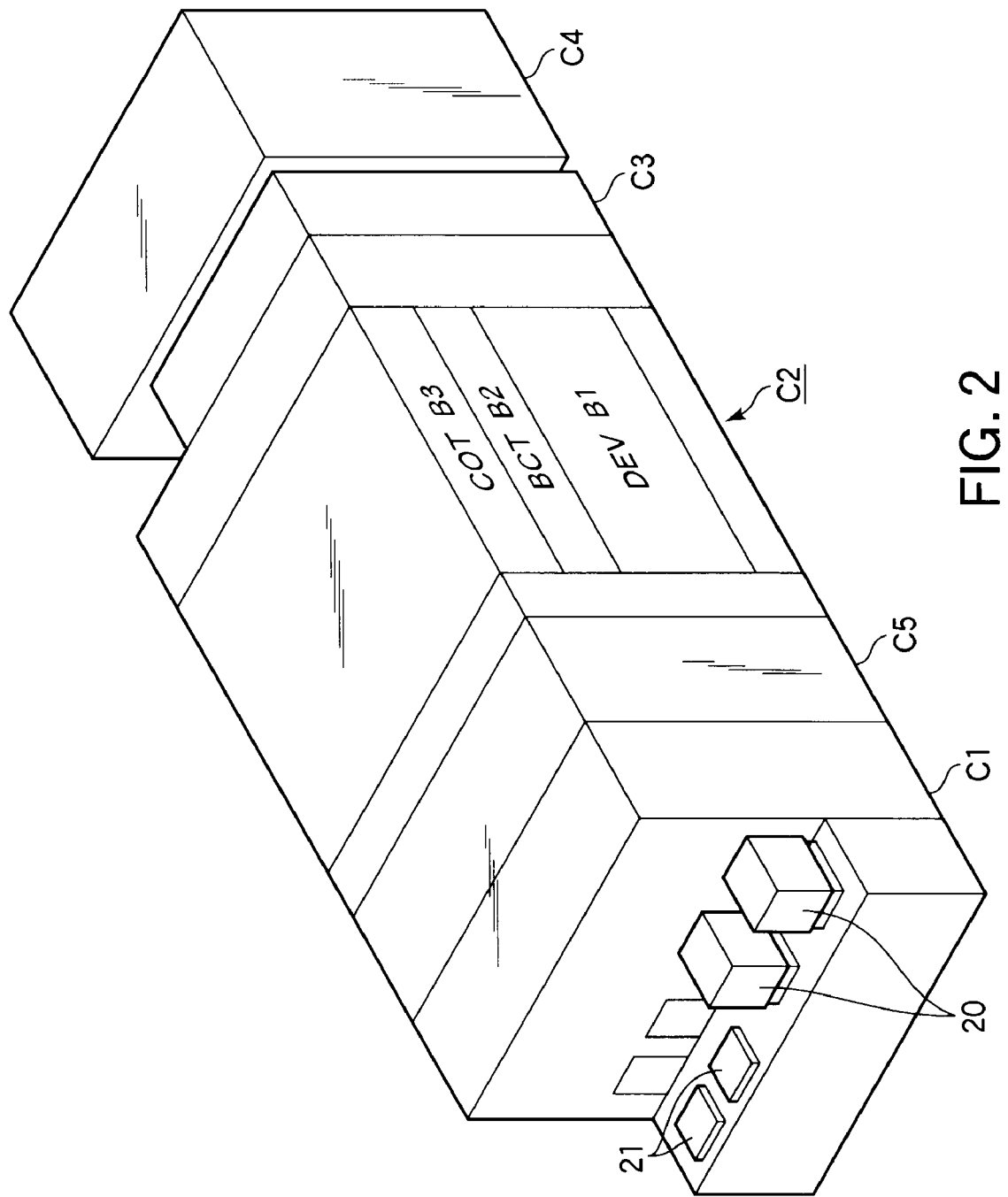
FIG. 2 is a perspective view showing the coating/developing apparatus.
Figure 3:
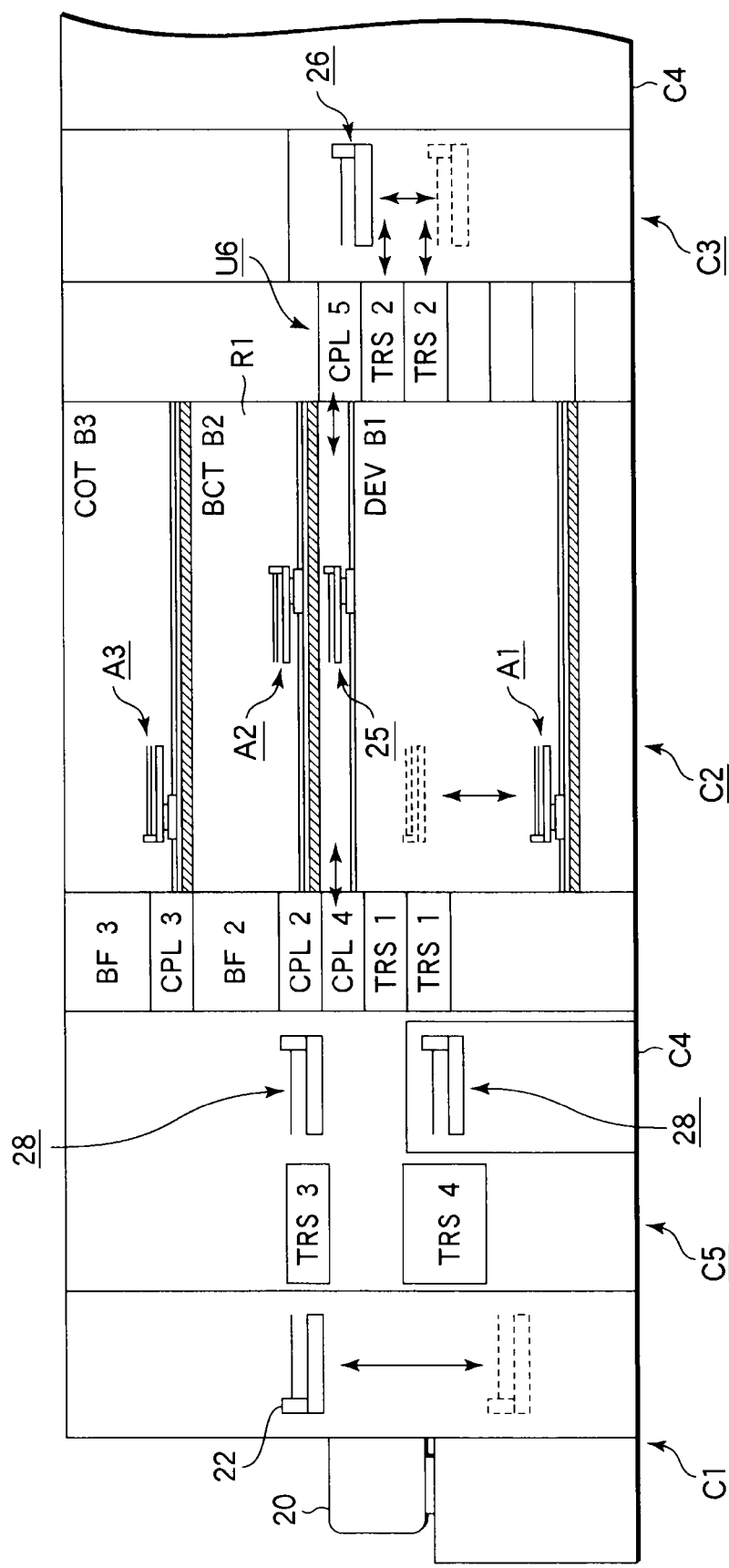
FIG. 3 is a sectional side view showing the coating/developing apparatus.

FIG. 1 is a sectional plan view showing a resist pattern formation system including a coating/developing apparatus 2 and a light exposure apparatus C4 connected to each other. FIG. 2 is a perspective view of the system. FIG. 3 is a sectional side view of the system. This development apparatus 2 includes a carrier block C1 with a table 21 on which carriers 20 of an airtight type are placed. A transfer arm 22 is disposed to take out wafers W from the carriers 20 and transfer them to a process block C2 through an examination block C5, and to receive processed wafers W from the process block C2 through the examination block C5 and return them to the carriers 20.

In this example, as shown in FIG. 2, the process block C2 includes a first block (DEV layer) B1 for performing a developing process, a second block (BCT layer) B2 for forming an anti-reflection film below a resist film, a third block (COT layer) B3 for applying the resist film, which are laminated in this order from below.

Since the respective layers of the process block C2 have the same arrangement in the plan view, the second block (BCT layer) B2 will be explained as an example. The BCT layer B2 includes an anti-reflection film formation module 3, shelf units U1 to U4, and a transport arm A2. The anti-reflection film formation module 3 includes three coating sections 31 each for applying a chemical liquid by spin coating to form the anti-reflection film below the resist film. The shelf units U1 to U4 constitute a group of heating/cooling type process modules for performing a pre-treatment and a post-treatment before and after the process performed in the anti-reflection film formation module 3. The transport arm A2 is disposed between the anti-reflection film formation module 3 and process module group to transfer substrates or wafers W among these portions. The shelf units are arrayed along a transport area R1 through which the transport arm A is moved, and include heating modules and cooling modules laminated one on top of the other. The heating modules and cooling modules respectively includes heating plates and cooling plates, so that a wafer W placed on a heating plate or cooling plate is heated or cooled in accordance with the temperature of the heating plate or cooling plate.

Figure 4:
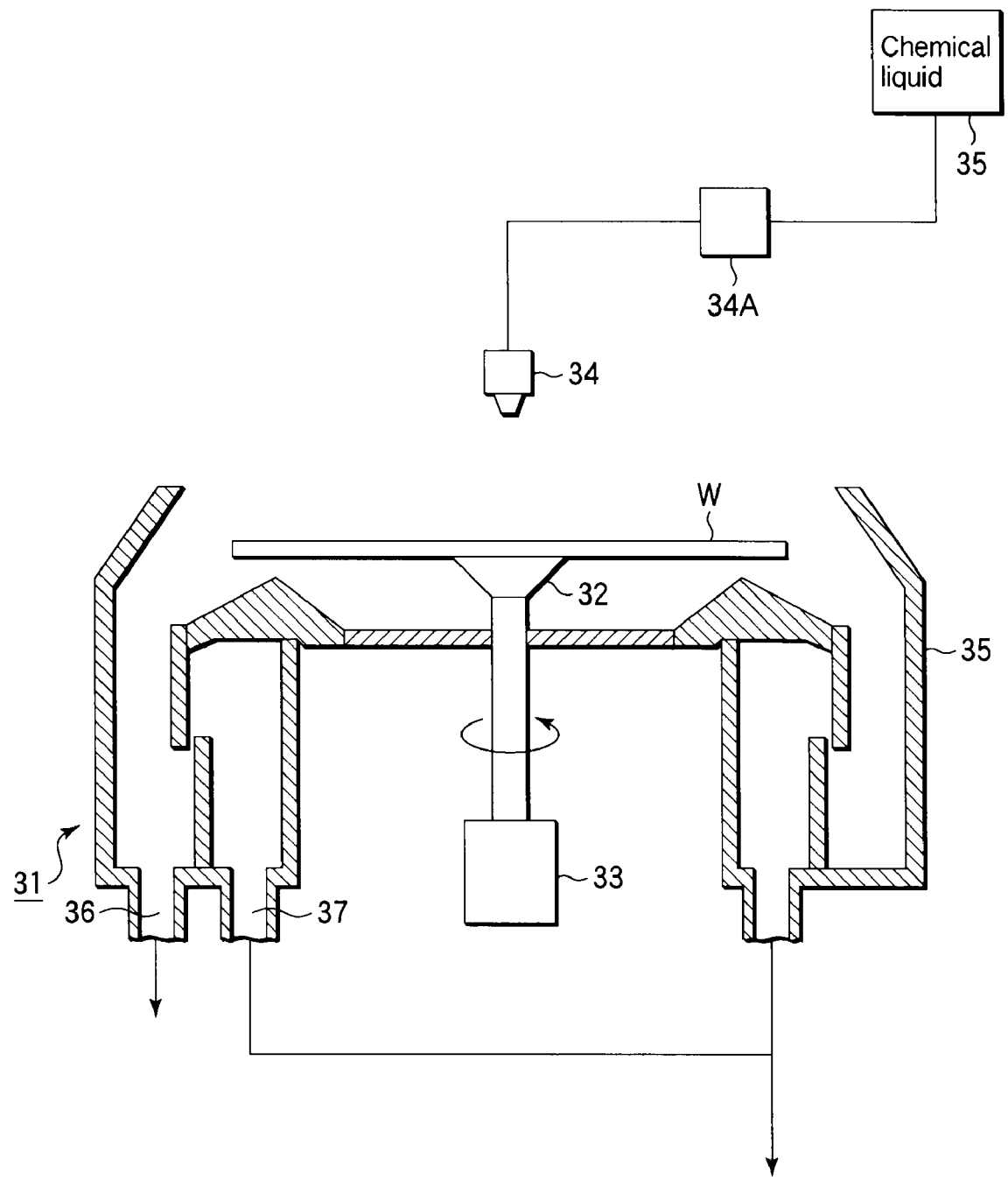
FIG. 4 is a structural view showing an anti-reflection film formation module disposed in the coating/developing apparatus.

FIG. 4 shows the structure of the coating section 31, which includes a spin chuck 32 configured to hold the back side central portion of a wafer W and a driving unit 33 configured to rotate the spin chuck 32. A chemical liquid for forming an anti-reflection film is supplied from a chemical liquid supply nozzle 34 onto the central portion of a wafer W held on the spin chuck 32 and the spin chuck 32 is rotated, so that the chemical liquid is spread toward the peripheral portion of the wafer W by a centrifugal force, i.e., the wafer W is entirely coated with the chemical liquid by so-called spin coating. The chemical liquid supply nozzle 34 is connected to a chemical liquid supply source 35 through a supply line provided with a chemical supply hardware set 34A thereon. The chemical liquid supply hardware set 34A includes valves and a mass-flow control, and is configured to receive control signals output from the control section 7 and to control the supply and stop of the chemical liquid to the wafer W.

A cup 35 for preventing the chemical liquid from scattering is disposed to surround the spin chuck 32, and is connected to a drain passage 36 and an exhaust passage 37, so that the temperature and humidity inside the cup 35 are controlled depending on gas displacement through the exhaust passage 37. The rotational speed of the spin chuck 32, the supply and stop of the chemical liquid from the chemical liquid supply nozzle 34, the gas displacement from the cup 35 are controlled in accordance with control signals output from the control section 7 to the anti-reflection film formation module 3.

The third block (COT layer) B3 has the same arrangement as the BCT layer B2 except that a resist is supplied in the coating section 31 in place of the chemical liquid for forming the anti-reflection film.

On the other hand, as shown in FIG. 3, the first block (DEV layer) B1 includes two developing modules laminated one on top of the other inside the DEV layer B1 in place of coating modules. Further, shelf units are disposed to constitute a group of heating/cooling type process modules for performing a pre-treatment and a post-treatment before and after the process performed in the development modules. The DEV layer B1 includes a transport arm A1 for transferring wafers W to and from the two developing modules, as well as the process modules. In other words, the transport arm A1 is commonly used for the developing modules disposed on upper and lower sides.

As shown in FIGS. 1 and 3, the process block C2 further includes a shelf unit U5 at a position accessible by the transport arms A. As shown in FIG. 3, the shelf unit U5 includes transit stages TRS1, transit stages CPL2 to CPL4 having a temperature adjusting function, and transit stages BF2 and BF3 for temporarily storing a plurality of wafers, so that wafers W are transferred among the transport arms A1 to A3. A transport arm D1 is disposed near the shelf unit U5 and is movable up and down to access the stages of the shelf unit U5.

Further, as shown in FIG. 3, the process block C2 includes a shelf unit U6 at a position accessible by the transport arm A1 and a shuttle arm 25 described later in the transport area R1 adjacent to the interface block C3. The shelf unit U6 includes transit stages TRS2 and CPL5, as in the shelf unit U5.

The shuttle arm 25 is disposed inside the DEV layer B1 at an upper position and is exclusively used as a transfer device for directly transferring a wafer W from a transit stage CPL4 of the shelf unit U5 into a transit stage CPL5 of a shelf unit U6. The interface block C3 includes an interface arm 26 to transfer wafers W between the respective stages of the shelf unit U6 and the light exposure apparatus C4.

The examination block C5 includes a transport arm 27 configured to transfer wafers W between a transit stage TRS3 for receiving a wafer from the transfer arm 22 of the carrier block B1 and a transit stage CPL2 disposed in the shelf unit U5 at a height position corresponding to the BCT layer B2. Further, the examination block C5 includes an examination module 4 and a transit stage BF4 disposed at a position accessible by the transfer arm 22 of the carrier block B1 and configured to temporarily store a plurality of wafers W. A transport arm 28 is disposed to transfer wafers W among the examination module 4, the transit stage BF4, and a transit stage TRS1 disposed in the DEV layer B1.

Figure 5:
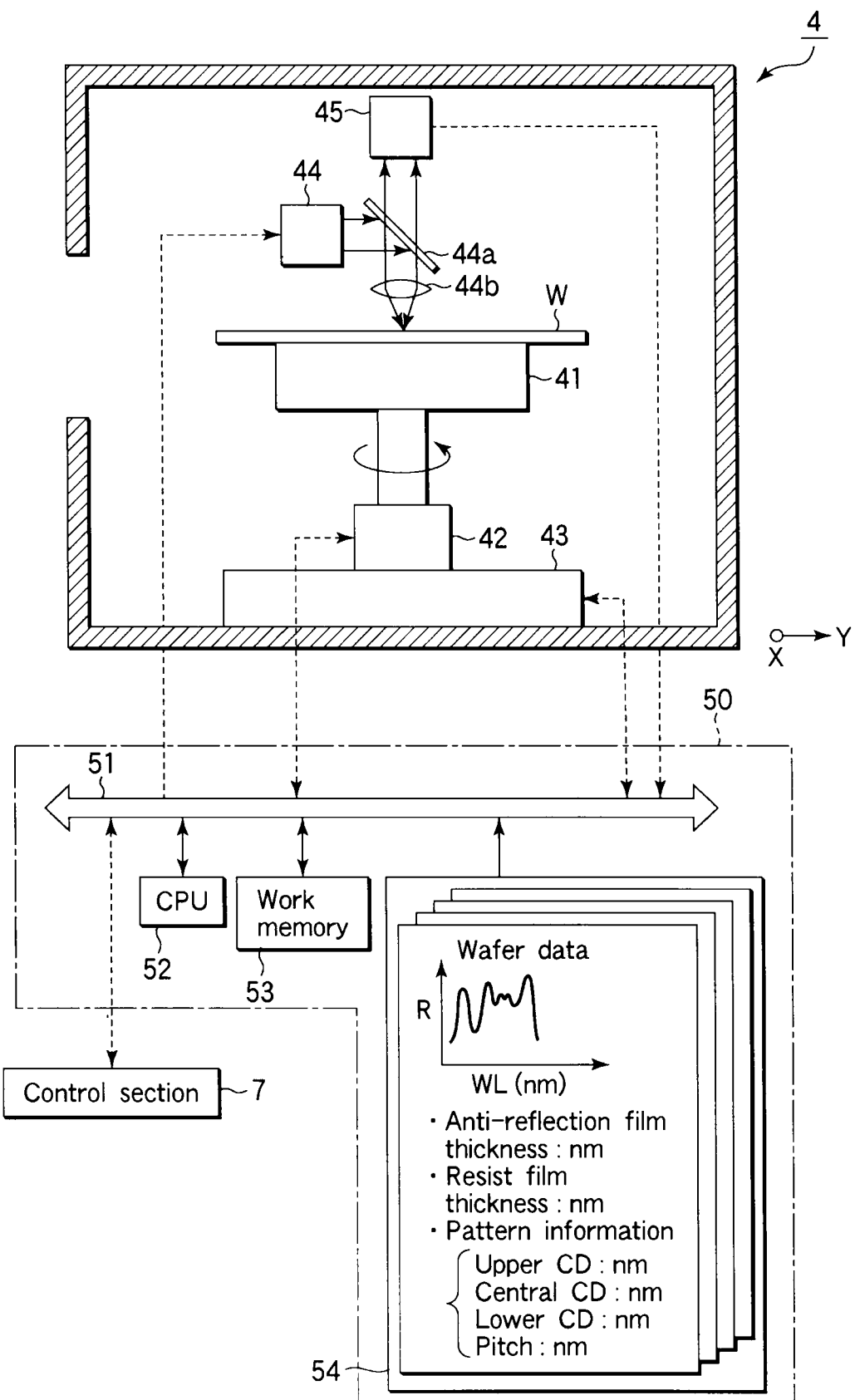
FIG. 5 is a structural view showing an examination module disposed in the coating/developing apparatus.

Next, the examination module 4 will be explained with reference to FIG. 5. The examination module 4 includes a stage 41 for placing a wafer W thereon, and a rotational driving member 42 disposed below the stage 41 to rotate the stage 41 about a vertical axis. The rotational driving member 42 is disposed on the XY-driving member 43 configured to move the rotational driving member 42 along with the stage 41 in two directions perpendicular to each other (X- and Y-directions in FIG. 5) on a horizontal plane.

Figure 6A:
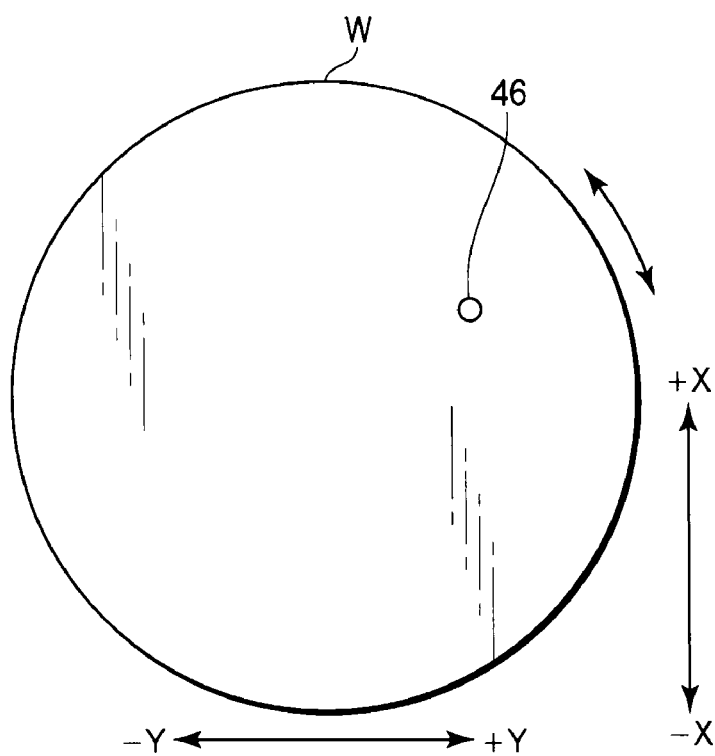
FIGS. 6A and 6B are views for explaining a manner of performing an examination in the examination module.
Figure 6B:
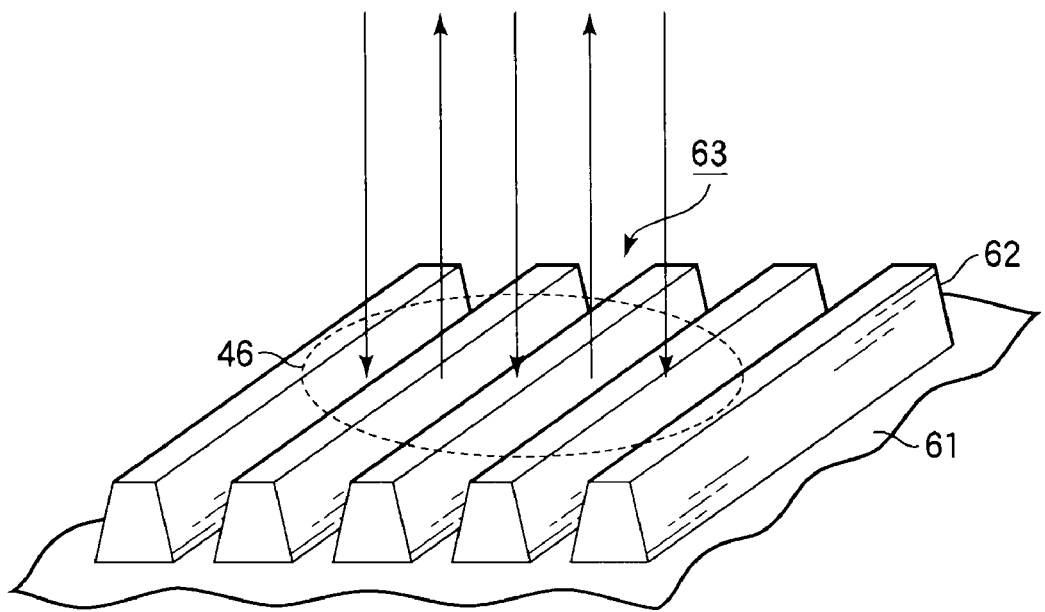

A light radiating portion 44 is disposed above the stage 41 and includes a light source and so forth to radiate light onto the wafer W placed on the stage 41. A light receiving portion 45 is disposed on the stage 41 to receive light reflected from the wafer W and incident with a predetermined angle. A reflected mirror 44a and a condensing lens 44b are disposed such that light radiated from the light radiating portion 44 passes through the reflected mirror 44a and condensing lens 44b onto the wafer W and light reflected from the surface of the wafer W is incident onto the light receiving portion 45. FIGS. 6A and 6B show an area 46 irradiated with light from the light radiating portion 44. The wafer W placed on the stage 41 is moved by the driving members 42 and 43, so that the irradiation area 46 can be shifted to any position on the wafer W. In FIG. 6B, light radiated onto the irradiation area 46 and light reflected from the irradiation area 46 are indicated by arrows.

The examination module 4 includes a controller 50 formed of, e.g., a computer to control operations of the respective portions of the examination module 4. The controller 50 includes a bus 5 connected to a CPU 52, a work memory 53 for performing various arithmetical operations, and a storage section 54 used as a first storage section.

The storage section 54 stores a lot of data of wafers as a data library in which each of light information profiles is set correlated with data concerning the anti-reflection film thickness, resist film thickness, and resist pattern information on a wafer from which the light information profile has been obtained. Specifically, the storage section 54 stores data comprising correlations of different pattern information units of the resist pattern (including at least a line width of the resist pattern), different values of the film thickness of the anti-reflection film (underlying film), and different light information profiles. As explained in Description of the Related Art, the light information profiles are obtained based on actual measurement results and simulations for various wafers W with a resist pattern formed thereon, and each of them shows the relationship between the reflection coefficient (R) and wavelength (WL) of light (see FIG. 5) obtained by examinations of the wafers W in the examination module 4.

Figure 7:
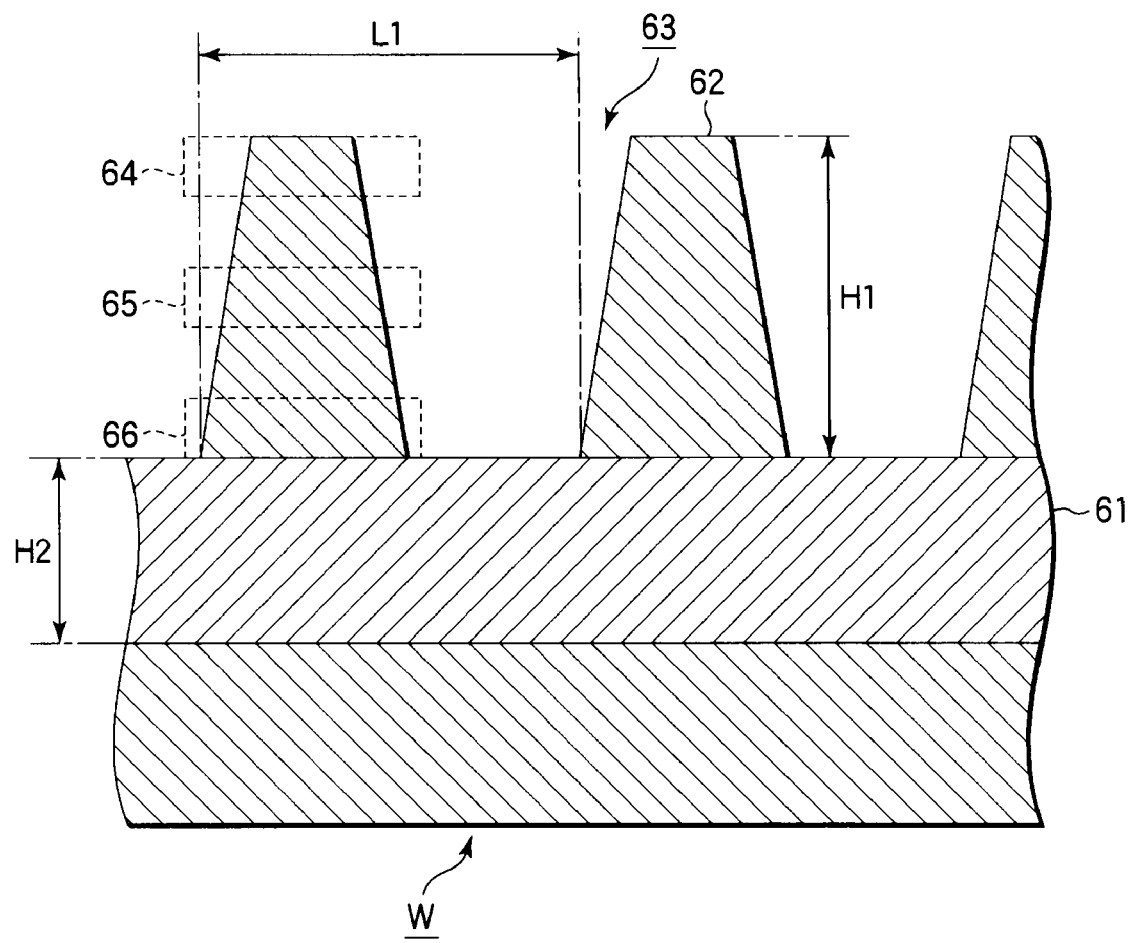
FIG. 7 is a sectional side view showing a wafer treated as an examination target.

In this embodiment, as shown in FIG. 7, the pattern information is formed of the film thickness H1 of a resist film 62, the line width average values (which will be respectively referred to as upper CD, central CD, and lower CD) respectively at an upper part 64, a central part 65, and a lower part 66 of protruded portions forming a resist pattern 63, which are surrounded by broken lines in FIG. 7, and the width (pitch) L1 of a pair of recessed and protruded portions adjacent to each other in the resist pattern 63. Each of the upper part 64, central part 65, and lower part 66 has a height that corresponds to 20% of the entire height of the resist pattern 63. Where the top height of the resist pattern 63 is expressed as 0% and the bottom height of the resist pattern 63 is expressed as 100%, the upper part 64, central part 65, and lower part 66 are parts of 0 to 20%, of 40 to 60%, and of 80 to 100%, respectively. As described later, the film thickness H2 of an anti-reflection film 61 in the irradiation area 46 is obtained by a selected recipe and an anti-reflection film thickness distribution corresponding to the recipe.

The controller 50 transmits control signals to the rotational driving member 42, XY-driving member 43, light radiating portion 44, and light receiving portion 45 to control their operations, so that light is radiated from the light radiating portion 44 onto a predetermined position on the surface of the wafer W with the resist pattern formed thereon. The light thus radiated is reflected into the light receiving portion 45 with a predetermined angle, and a signal corresponding to the light thus received by the light receiving portion 45 is transmitted therefrom to the controller 50. Based on the signal, the controller 50 obtains a light information profile representing the relationship between the wavelength of the light and the reflection coefficient, which is information included in the light. Further, the controller 50 is connected to the control section 7. When an examination is performed by the examination module 4, the controller 50 provides the control section 7 with a signal corresponding to the position (measurement coordinates) of the light-irradiation area 46 on the wafer W to obtain data concerning the anti-reflection film thickness at the position from the control section 7.

Figure 8:
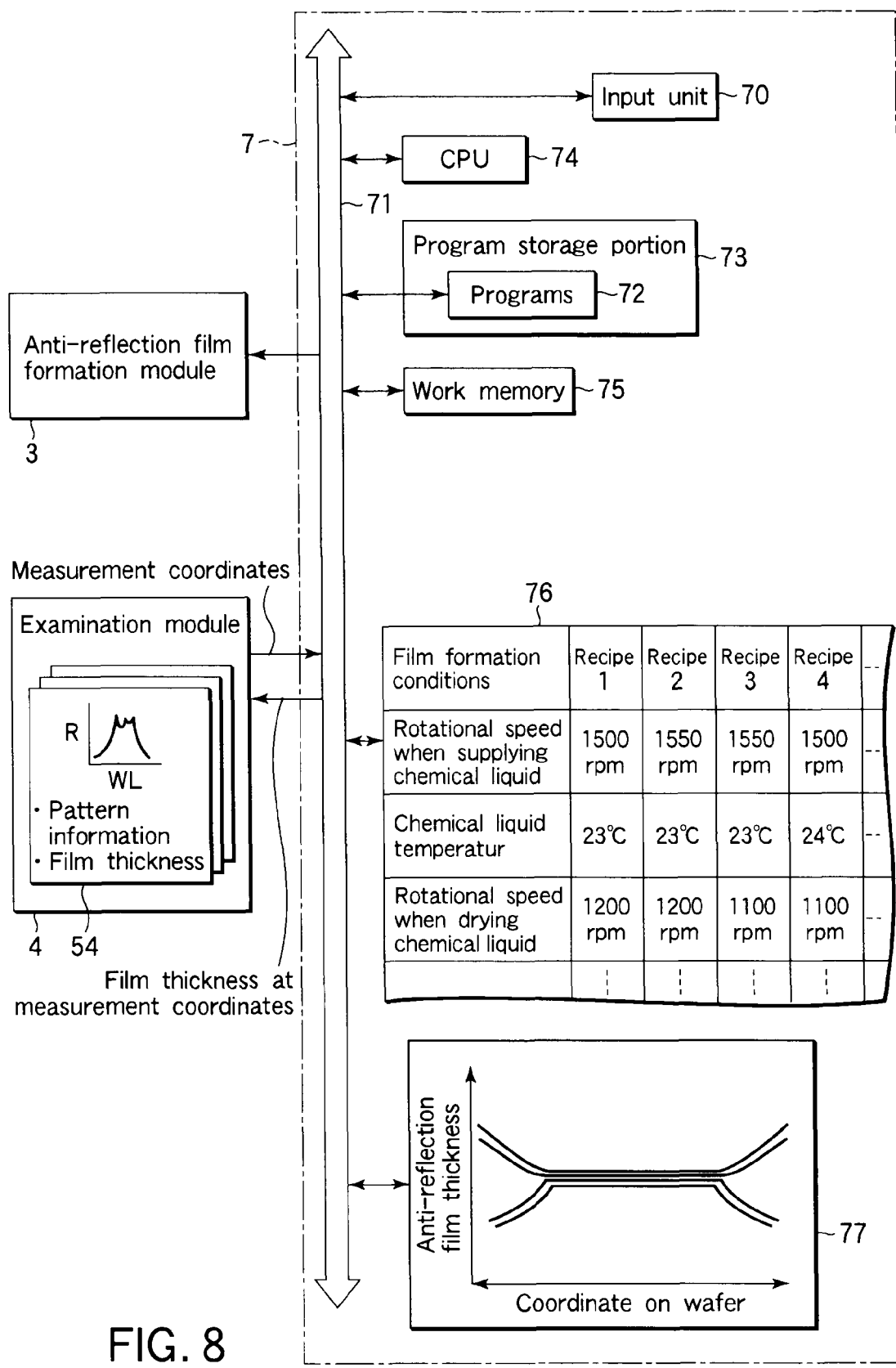
FIG. 8 is a structural view showing a control section disposed in the coating/developing apparatus.

Next, with reference to FIG. 8, an explanation will be given of the control section 7 comprising, e.g., a computer disposed in the coating/developing apparatus. The control section 7 includes a bus 71 connected to a program storage portion 73 that stores programs 72. Each of the programs 72 includes instructions (concerning respective steps) to transmit control signals from the control section 7 to the respective portions of the coating/developing apparatus 1 to conduct a coating/developing process described later. The programs 72 are installed into the control section 7 by use of a program storage portion 73 comprising a computer storage medium, such as a flexible disk, compact disk, hard disk, or MD (magnetic optical disk).

The bus 71 is connected to a CPU 74 and a work memory 75 for performing various arithmetical operations. The bus 71 is further connected to a storage section (second storage section) that stores correlations of a number of recipes, which comprise various film formation conditions (process parameters) for forming the anti-reflection film, with anti-reflection film thickness distributions on the surface of a wafer W formed by the respective recipes. For the sake of convenience, this storage section is shown as a table 76 and data 77 in FIG. 8, which are displayed on a display screen (not shown), such as the display of the control section 7.

For example, the film formation conditions of each of the recipes include the rotational speed of the wafer W on the spin chuck 32 when a chemical liquid is delivered from the chemical liquid supply nozzle 34 of the anti-reflection film formation module 3; the temperature of the chemical liquid; the viscosity of the chemical liquid; the rotational speed of the wafer W when the chemical liquid supplied on the wafer W is dried after the chemical liquid delivery is stopped; the chemical liquid delivery time from the nozzle 34; the heating temperature of the wafer W in a heating module through which the wafer W is transferred after the chemical liquid coating; the cooling temperature of the wafer W in a cooling module through which the wafer W is transferred before being transferred to the anti-reflection film formation module 3; and the temperature and humidity inside the cup 35. Each of the recipes is set correlated with the film formation conditions and is stored in the storage section. Then, as shown in the table 76, correlations of the recipes with film formation conditions are displayed on the display screen. Accordingly, users can select a recipe through an input unit 70, such as a keyboard connected to the bus 71, so that the film formation conditions corresponding to the selected recipe can be set all together.

Figure 9:
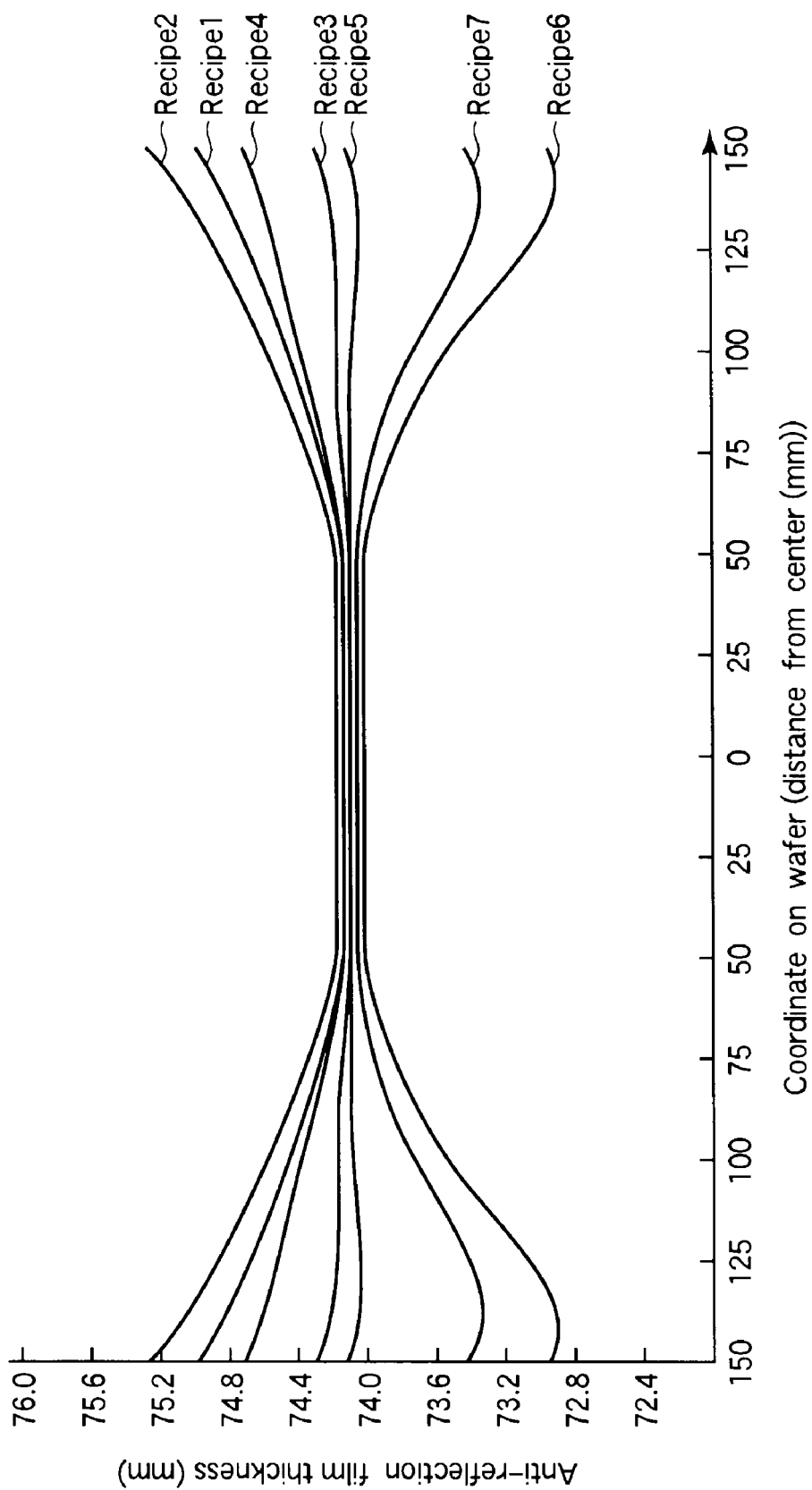
FIG. 9 is a graph showing anti-reflection film thickness distributions formed by respective recipes.

The data 77 shows film thickness distributions in a radial direction of a wafer W having a diameter of 300 mm. FIG. 9 is a graph showing the data 77 in detail, in which the horizontal axis denotes a coordinate of the wafer (a distance from the center of the wafer in a radial direction: in the unit mm) with "0" at the center of the wafer W and "150" at the edge wafer W. According to this graph, in the annular direction of the wafer W, the film thickness is constant at positions where the distance from the center of the wafer is equal. The vertical axis denotes values of the formed anti-reflection film thickness. The bus 71 is connected to the anti-reflection film formation module 3. When a recipe is selected by a user through the input unit 70, the operations of the anti-reflection film formation module 3 and respective modules for performing heating and cooling processes before and after the process in the module 3 are controlled in accordance with the film formation conditions corresponding to the selected recipe, as described later. Consequently, as shown in the data 77A, an anti-reflection film is formed having a film thickness distribution corresponding to the selected recipe. The table 76 and data 77 can be determined based on experimental data obtained by forming an anti-reflection film under various film formation conditions when the coating/developing apparatus is installed in a factory or when a test is performed after the power supply of the apparatus is turned on and before products are manufactured, for example.

Figure 10:
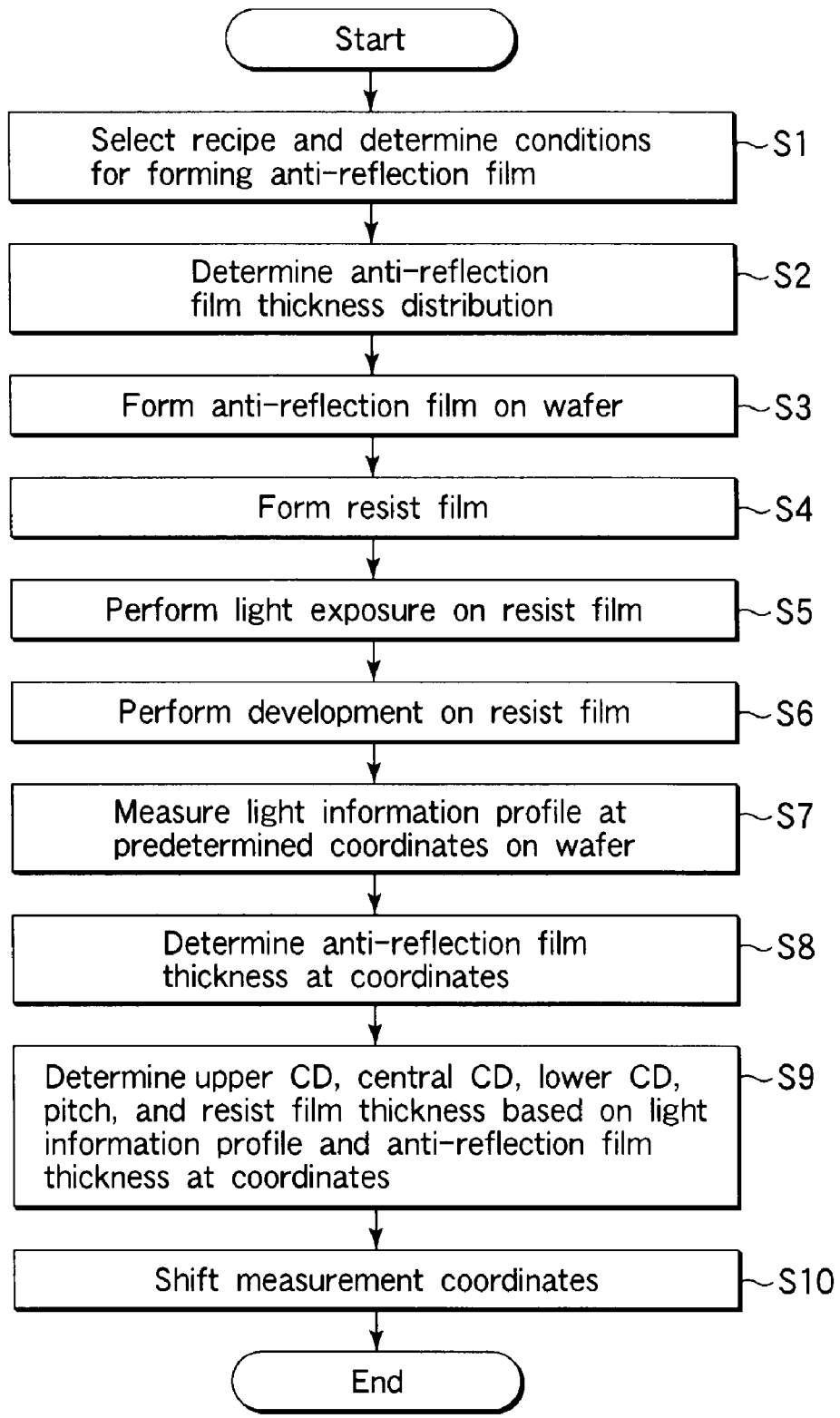
FIG. 10 is a flow chart showing a coating/developing method according to an embodiment of the present invention.

Next, with reference to FIG. 10, an explanation will be given of a series of steps for forming a resist pattern on a wafer W by the coating/developing apparatus according to this embodiment and obtaining its pattern information. At first, a recipe for forming an anti-reflection film is selected by a user through the input unit 70, and film formation conditions for forming the anti-reflection film are determined (step S1).

In accordance with the film formation conditions thus determined, control is exerted on the temperature of a chemical liquid in the chemical liquid supply source 35 of the anti-reflection film formation module 3; the temperature of a cooling plate in a cooling module included in the shelf units of the BCT layer B2; the temperature of a heating plate in a heating module included in the shelf units of the BCT layer B2; and the temperature and humidity inside the cup 35 of the anti-reflection film formation module 3. Further, an anti-reflection film thickness distribution corresponding to the selected recipe is read out and determined by the control section 7 from the storage section, and is displayed on the display screen (step S2).

Thereafter, a carrier 20 storing wafers W is placed on the table 21 from, e.g., outside and wafers W are taken out from the carrier 20 by the transfer arm 22. Each of the wafers W is transferred through the transit stage TRS3 and transfer arm 27 to the transit stage CPL2 corresponding to the second block (BCT layer) B2. The wafer W is received by the transport arm A2 of the second block (BCT layer) B2 from the transit stage CPL2 and is transferred to a cooling plate in a cooling module included as a shelf in the shelf units U1 to U4. The wafer W is cooled on the cooling plate set at a cooling temperature, and is transferred to the anti-reflection film formation module 3.

In the anti-reflection film formation module 3, the wafer W is placed on the spin chuck 32 and is rotated at a rotational speed set in accordance with the selected recipe, and then a chemical liquid with an adjusted temperature is supplied onto the wafer W. After the elapse of a set time from the chemical liquid supply start, the chemical liquid supply is stopped, and the rotational speed of the wafer W is decreased. Then, the wafer W is kept rotated at a set rotational speed to dry the solvent of the chemical liquid supplied on the wafer W. Thereafter, the wafer W is transferred by the transport arm A2 to a heating module included in a shelf unit, and is heated on the heating plate set at a heating temperature. Consequently, an anti-reflection film is formed with a film thickness distribution determined as described above (step S3).

Thereafter, the wafer W is transferred through the transport arm A2, the transit stage BF2 of the shelf unit U5, the transfer arm D1, the transit stage CPL3 of the shelf unit U5, and the transport arm A3 to the third block (COT layer) B3. Then, the wafer W is cooled by the cooling module included in a shelf unit of the COT layer B3, and is transferred to the coating unit of the COT layer B3. Then, the wafer W is supplied with a resist liquid in the coating unit, and is then heated in a heating module included in the shelf unit, so that a resist film is formed (step S4).

The wafer W with the resist film formed thereon is transferred through the transport arm A3, the transit stage BF3 of the shelf unit U5, and the transfer arm D1 to the transit stage BF3 in the shelf unit U5. Thereafter, the wafer W is transferred by the transfer arm D1 from the transit stage BF3 to the transit stage CPL4. Then, the wafer W is directly transferred by the shuttle arm 25 to the transit stage CPL5 in the shelf unit U6, and is then transferred into the interface block C3. Then, the wafer W is transferred by the interface arm 26 to the light exposure apparatus C4, and is subjected to light exposure in accordance with a predetermined pattern (step S5).

After the wafer W is treated by the light exposure process in the light exposure apparatus C4, the wafer W is transferred by the interface arm 26 to the transit stage TRS2 of the shelf unit U6. Thereafter, the wafer W is sequentially transferred by the transport arm A1 to a heating module and a cooling module included in the shelf unit U1 of the DEV layer B1, in which the wafer W sequentially receives heating and cooling processes. Then, the wafer W is transferred to the development module, in which a development liquid is supplied onto the wafer W, so that a resist pattern is formed based on the light exposed portions (step S6). The wafer W with the resist pattern formed thereon is transferred by the transport arm A1 to the transit stage TRS1, and is then transferred by the transport arm 28 to the examination module 4.

After the wafer W is placed on the stage 41 of the examination module 4, the stage 41 is moved to, e.g., a predetermined position by the driving members 42 and 43, and light is radiated from the light radiating portion 44 onto an area with the resist pattern formed therein on the wafer W. Light reflected from this irradiation area 46 is received by the light receiving portion 45, and the controller 50 of the examination module 4 performs arithmetical operations to obtain the light information profile of the reflected light thus received. The waveform of the obtained light information profile is displayed on the display screen together with the position of the irradiation area 46 on the surface of the wafer W (step S7). Further, in addition to the arithmetical operations for the light information profile, the controller 50 transmits a signal corresponding to the position of the irradiation area 46 irradiated with light from the light radiating portion 44. The control section 7 determines the anti-reflection film thickness at the irradiation area 46 based on this signal and the film thickness distribution corresponding to the selected recipe (step S8). The control section 7 displays this film thickness on the display screen and transmits a signal corresponding to the film thickness to the controller 50.

Figure 11A:
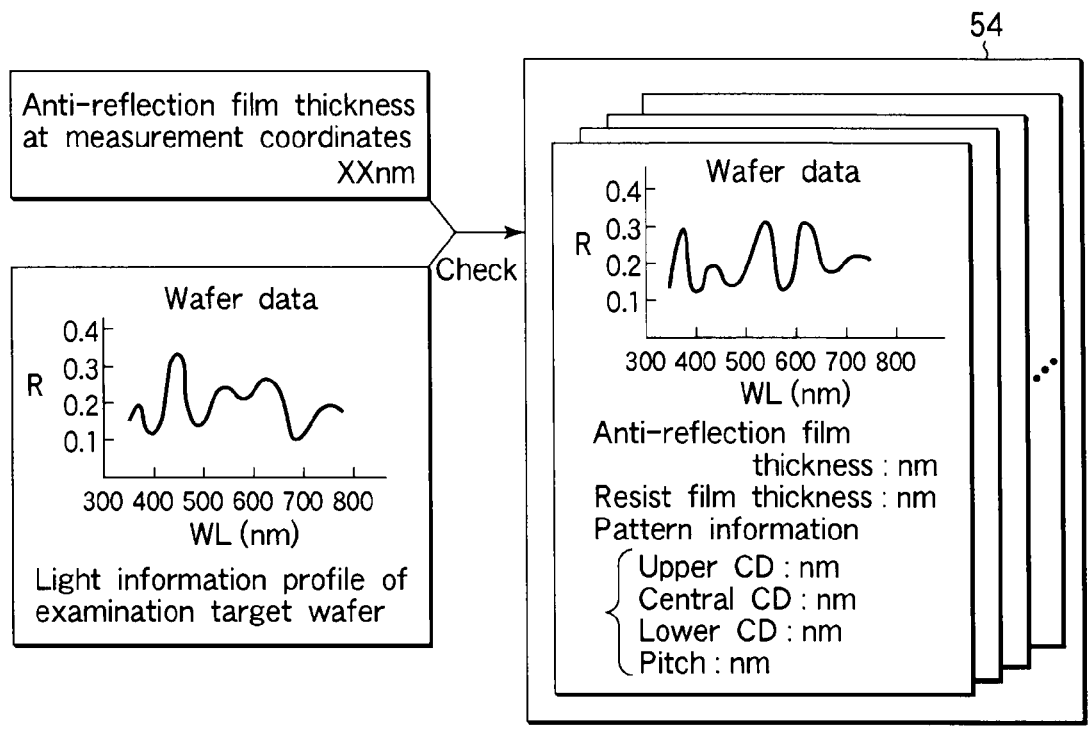
FIGS. 11A and 11B are views for explaining a manner of obtaining the resist pattern information of a wafer.
Figure 11B:
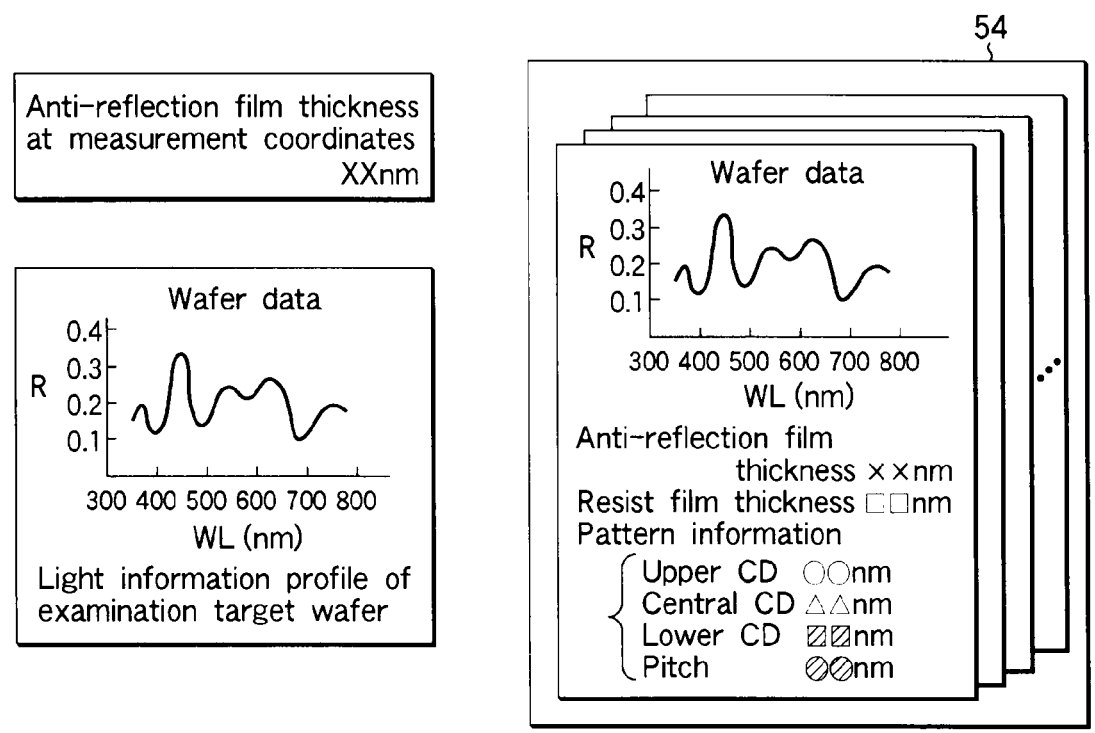

When the controller 50 of the examination module 4 receives the signal corresponding to the film thickness transmitted from the control section 7, the controller 50 checks the obtained light information profile of the wafer W and the determined anti-reflection film thickness against data of wafers stored in the storage section 54, as shown in FIG. 11A, so as to find data that conforms or most approximates to the target in terms of both of the anti-reflection film thickness and light information profile waveform (FIG. 11B). Then, the controller 50 displays the anti-reflection film thickness and light information profile waveform retrieved from the storage section 54 on the display screen. Further, the controller 50 reads out the upper CD, central CD, lower CD, and pitch and the resist film thickness, which are included in resist pattern information stored in correlation with the anti-reflection film thickness and light information profile. The controller 50 displays them on the display screen as the pattern information and resist film thickness of the wafer W examined by the examination module 4 (step S9).

Then, the wafer W is moved to a predetermined position by the driving members 42 and 43 (step S10), and the steps S7 to S10 are performed again. In this way, resist pattern information is obtained for all the preset measurement coordinates, and, thereafter, the wafer W is transferred by the transport arm 28 to the transit stage BF4, and is then returned to the carrier 20 by the transfer arm 22.

According to the coating/developing apparatus described above, each of the selectable recipes includes film formation conditions that correlates the anti-reflection film formation module 3 for performing a film formation process with shelf unit modules for performing cooling and heating processes before and after the film formation process, so that an anti-reflection film is formed with a film thickness distribution corresponding to the selected recipe. Then, the anti-reflection film thickness of an irradiation area 46 irradiated with light in the examination module 4 is determined with reference to the film thickness distribution. The determined film thickness and obtained light information profile are checked against data comprising the pattern information correlated with the anti-reflection film thickness in the storage section 54. Consequently, measurement errors due to fluctuations of the anti-reflection film thickness on the surface of a wafer W can be decreased. In other words, the anti-reflection film thickness at the irradiation area 46 used for the checking operation against the data can less differ from the actual anti-reflection film thickness at the irradiation area 46. As a result, resist pattern information can be obtained with high accuracy, and the throughput can be prevented from being lower because the anti-reflection film thickness does not need to be obtained by an examination.

Second Embodiment

Figure 12:
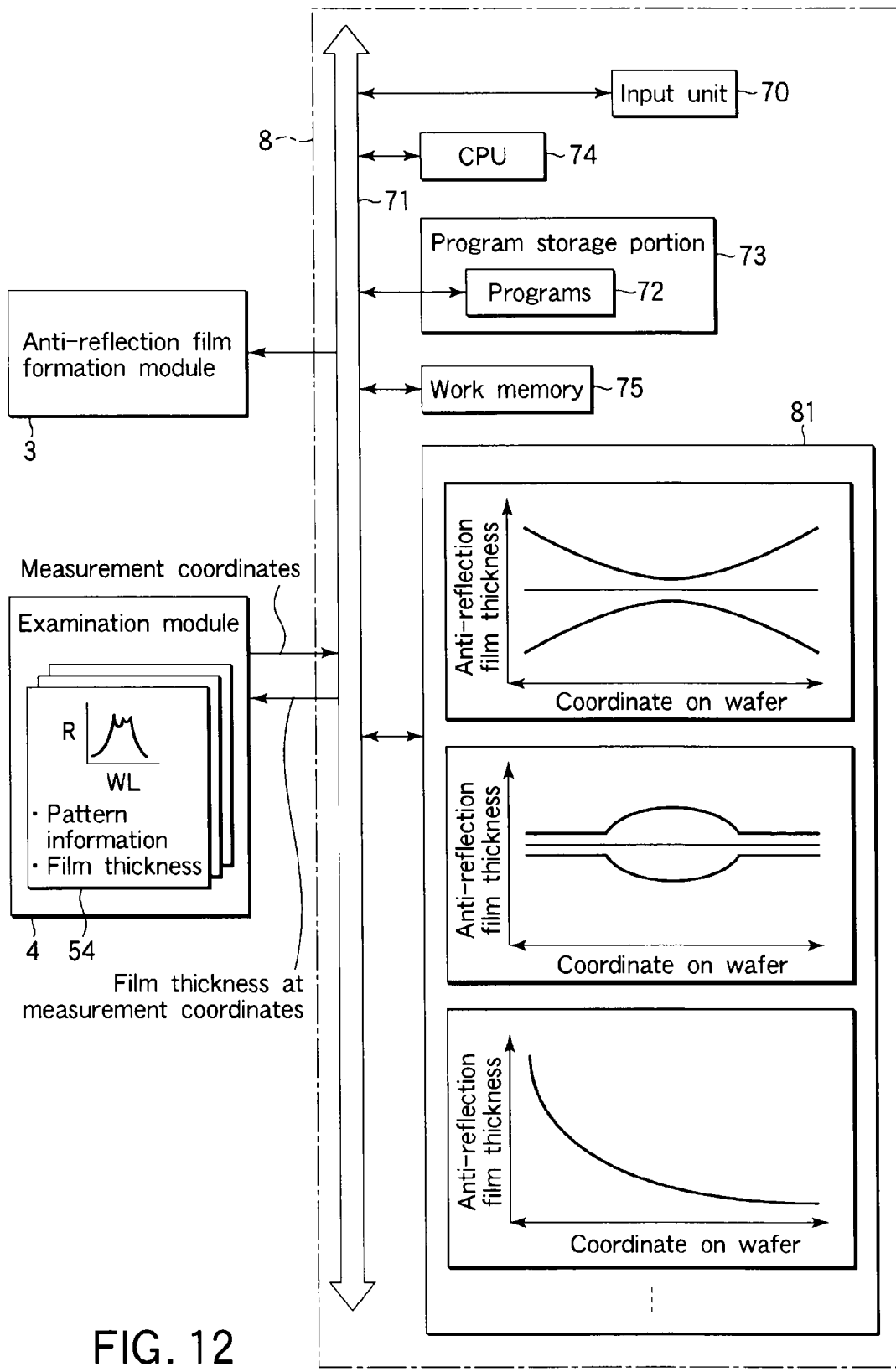
FIG. 12 is a structural view showing a control section having an arrangement different from the control section described above.
Figure 13A:
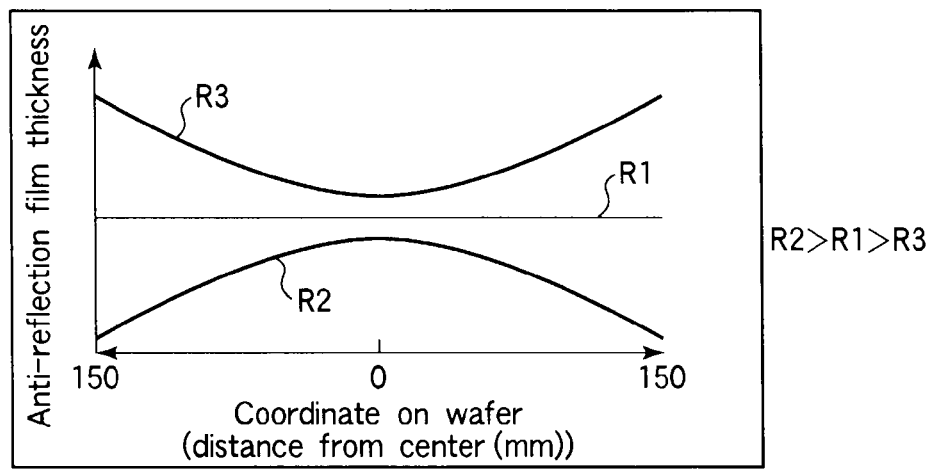
FIGS. 13A to 13C are views for explaining a change in a film thickness distribution along with a change in film formation conditions.
Figure 13B:
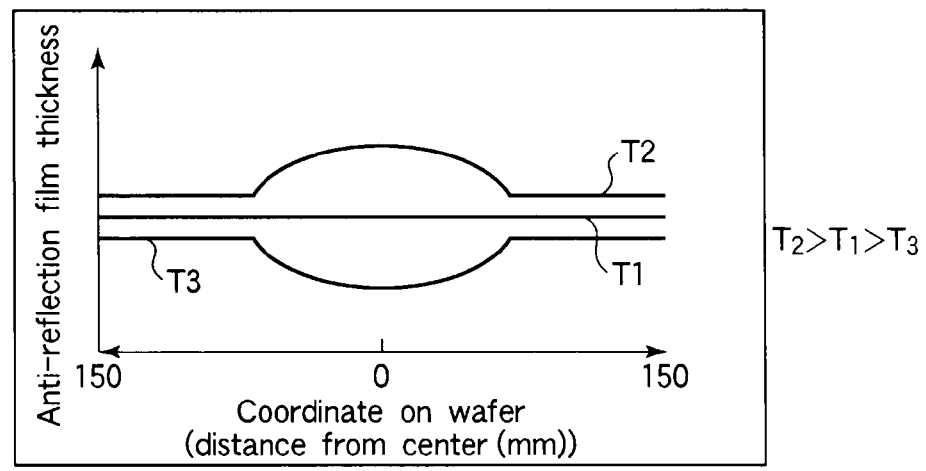
Figure 13C:
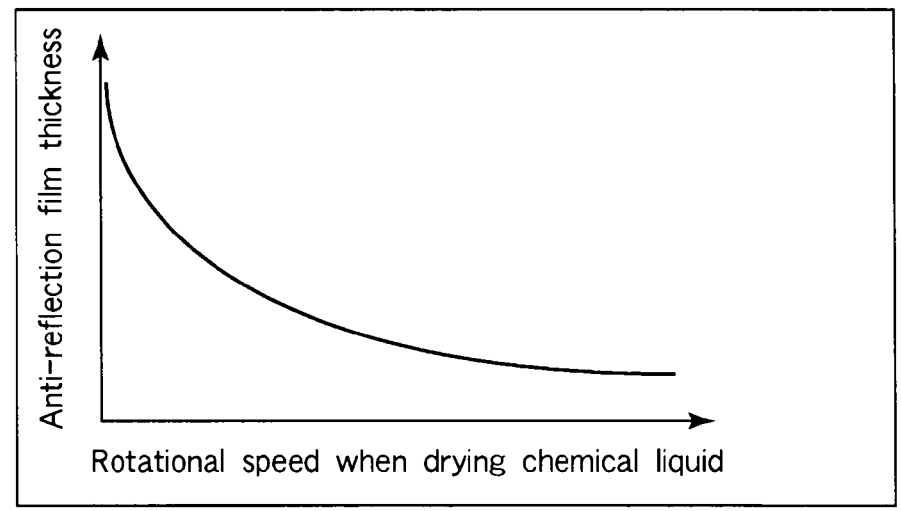

Incidentally, there is a case where an anti-reflection film is formed under film formation conditions different from those preset in a recipe. FIG. 12 shows the arrangement of a control section 8 for the coating/developing apparatus, which can obtain the anti-reflection film thickness at an irradiation area 46 in such a case. In FIG. 12, portions having the same arrangement of the control section 7 are denoted with the same reference symbols. The control section 8 includes a bus 71 connected to a storage portion 81. As regards each set of film formation conditions for forming an anti-reflection film, the storage portion 81 stores data for calculating a change in the anti-reflection film thickness distribution corresponding to a change in the film formation conditions. FIGS. 13A to 13C shows of the images of data of this kind.

FIG. 13A shows the image of data stored in the storage portion 81 concerning a planar change in the film thickness distribution of an anti-reflection film corresponding to a change in the rotational speed in the chemical liquid delivery, where the film formation conditions are constant except for the rotational speed in the chemical liquid delivery. As shown in the graph of FIG. 13A, in the chemical liquid delivery, where the rotational speed of a wafer is within a predetermined range R1, an anti-reflection film is formed with a predetermined film thickness uniform over the surface of the wafer W. Where the rotational speed is within a predetermined range R2 larger than R1, an anti-reflection film is formed with a film thickness smaller on the peripheral portion of the wafer W than on the central portion. Where the rotational speed is within a predetermined range R3 smaller than R1, an anti-reflection film is formed with a film thickness smaller on the central portion of the wafer W than on the peripheral portion.

FIG. 13B shows the image of data stored in the storage portion 81 concerning a planar change in the film thickness distribution of an anti-reflection film corresponding to a set value of the chemical liquid temperature, where the film formation conditions are constant except for the chemical liquid temperature. As shown in the graph of FIG. 13B, where the chemical liquid temperature is within a predetermined range T1, an anti-reflection film is formed with a uniform thickness over the surface of the wafer W. Where the chemical liquid temperature is within a predetermined range T2 larger than T1, an anti-reflection film is formed with a film thickness smaller on the peripheral portion of the wafer W than on the central portion. Where the chemical liquid temperature is within a predetermined range T3 smaller than T1, an anti-reflection film is formed with a film thickness smaller on the central portion of the wafer W than on the peripheral portion.

FIG. 13C shows the image of data stored in the storage portion 81 concerning a change in the film thickness distribution of an anti-reflection film corresponding to a set value of the wafer rotational speed in the chemical liquid drying, where the film formation conditions are constant except for the rotational speed in the chemical liquid drying. As shown in the graph of FIG. 13C, with an increase in the wafer rotational speed in the chemical liquid drying, the anti-reflection film thickness is smaller over the surface of the wafer W.

Other than the data described above, data is stored in the storage portion 81 concerning a change in an anti-reflection film on respective portions of the wafer W or over the entire surface of the wafer W, corresponding to a set value of some of the film formation conditions explained in the first embodiment.

Where a coating/developing process is performed, when film formation conditions are respectively set by a user through the display screen, the control section 8 reads out data from the storage portion 81 in accordance with the set film formation conditions. Then the control section 8 combines the data thus read out by use of a predetermined algorithm, and performs arithmetical operations to obtain an anti-reflection film thickness distribution in a radial direction of the wafer W as in the first embodiment. In other words, the control section 7 performs a simulation using data stored in the storage portion 81 in accordance with the input film formation conditions to determine an anti-reflection film thickness distribution. Then, as in the first embodiment, the anti-reflection film thickness at a position corresponding to the irradiation area 46 is determined, and the determined film thickness and the light information profile obtained by an examination are checked against the storage section 54 of the examination module 4 to determine resist pattern information. Also in this second embodiment, measurement errors due to fluctuations of the anti-reflection film thickness distribution can be decreased. As a result, resist pattern information can be obtained with high accuracy.

For example, the storage portion 81 may be connected to the bus 71 along with a storage section that stores data comprising correlations of the recipes with film thickness distributions, as in the table 76 and data 77 of the first embodiment. In this case, users can selectively perform selection of a recipe to form an anti-reflection film and setting of respective film formation conditions to form an anti-reflection film. When a recipe is selected by a user, resist pattern information is obtained in accordance with the first embodiment. When film formation conditions are respectively set, resist pattern information is obtained in accordance with the second embodiment. In the case of the first embodiment, since an anti-reflection film thickness distribution is determined in accordance with a recipe, tests are required to be performed when the apparatus is installed or every time when the power supply is turned on to start the apparatus, as described above, so that the relationship between various film formation conditions and anti-reflection film thickness distributions is obtained by trial and error (condition listing). However, where the storage portion 81 allows an anti-reflection film to be formed by use of film formation conditions not included in a recipe, anti-reflection film thickness distributions can be calculated by simulations and the number of prepared recipes can be thereby smaller. In this case, the time necessary for the condition listing is shortened, and the user's labor can be preferably simplified.

In the embodiments described above, the examination module 4 is disposed in the coating/developing apparatus. However, for example, an examination module 4 may be disposed as an examination apparatus separated from the coating/developing apparatus. In this case, a wafer treated by the coating/developing process may be returned to a carrier 20 and then examined by the examination apparatus, by transferring the carrier 20 to the examination apparatus on the way to a subsequent process step after the coating/developing process.

Third Embodiment

Figure 14:
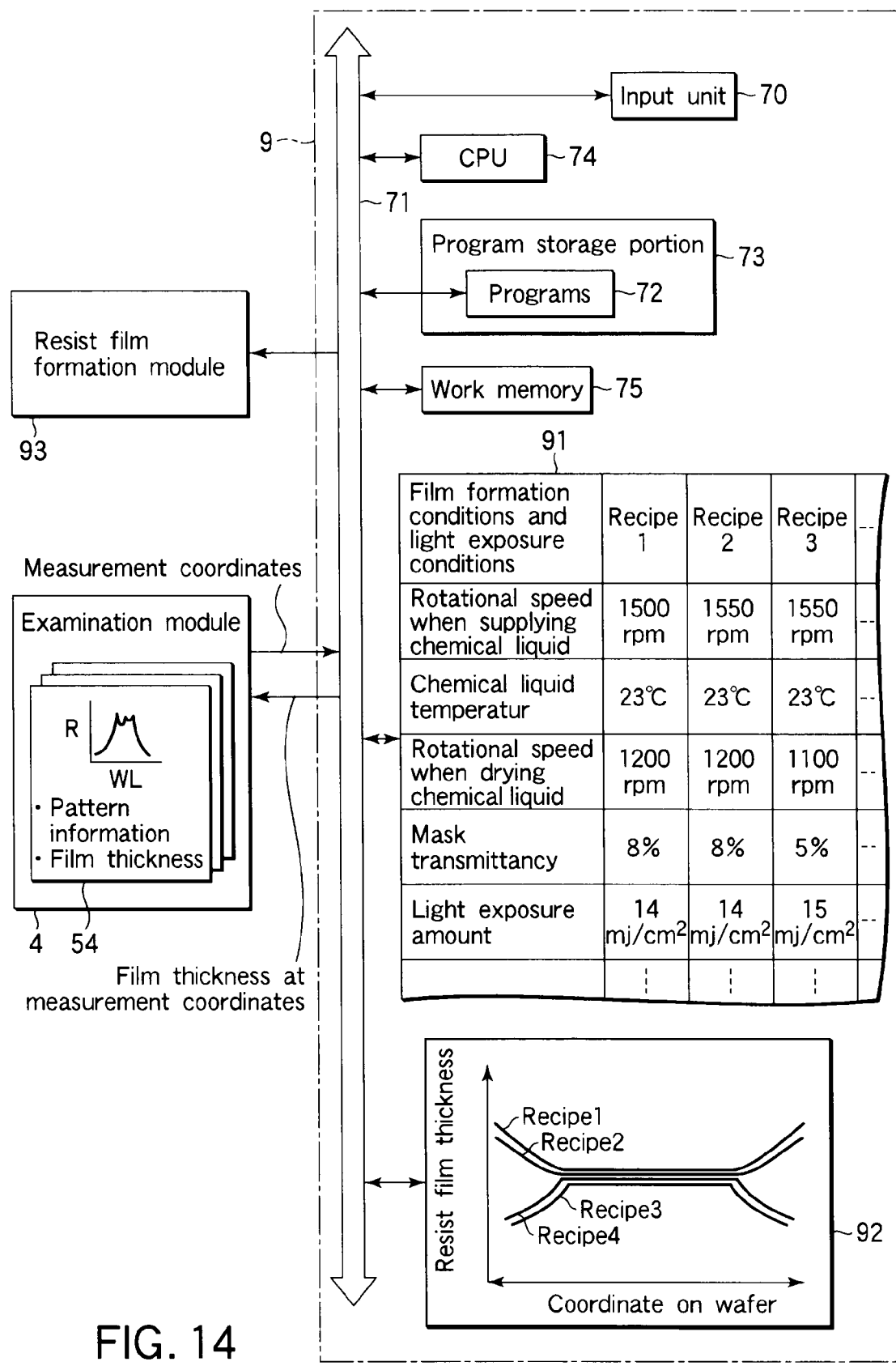
FIG. 14 is a structural view showing a control section having another alternative arrangement.

In the embodiments described above, an anti-reflection film thickness distribution is determined from film formation conditions for forming an anti-reflection film. However, in place of an anti-reflection film thickness distribution being determined, a resist film thickness distribution may be determined from film formation conditions (process parameters) for forming the resist film. FIG. 14 shows the arrangement of a control section 9 in which a recipe is selected, then a resist film thickness distribution corresponding to the recipe is determined, and then the resist film thickness at a light-irradiation area 46 is determined based on the film thickness distribution, as in the first embodiment.

Incidentally, when light exposure is performed in the light exposure apparatus C4, it is performed on a resist film by use of a mask having opening portions corresponding to the shape of a resist pattern. However, depending on the light exposure amount and mask transmittancy, light may be transmitted through an area of the mask other than the opening portions, while the resist surface is exposed light. Where the resist is of the positive type, since the surface is dissolved in development by a development liquid, the thickness of the resist film present in an examination after the development may be smaller than that obtained immediately after the formation. In light of this problem, the control section 9 is configured to allow users to set recipes in accordance with light exposure conditions, such as the mask transmittancy and light exposure amount, as well as various film formation conditions. The control section 9 includes a storage section that stores data comprising correlations of respective recipes with resist film thickness distributions after development. For the sake of convenience, this storage section is shown as a table 91 and data 92, as in the first embodiment.

Further, in the coating/developing apparatus including this control section 9, the storage section 54 of the examination module 4 stores no data concerning the anti-reflection film thickness but stores correlations of light information profiles with the resist film thickness and pattern information. This embodiment includes a resist film formation module 93 having the same arrangement as the anti-reflection film formation module 3 except that the chemical liquid applied to the wafer W is a resist.

Figure 15:
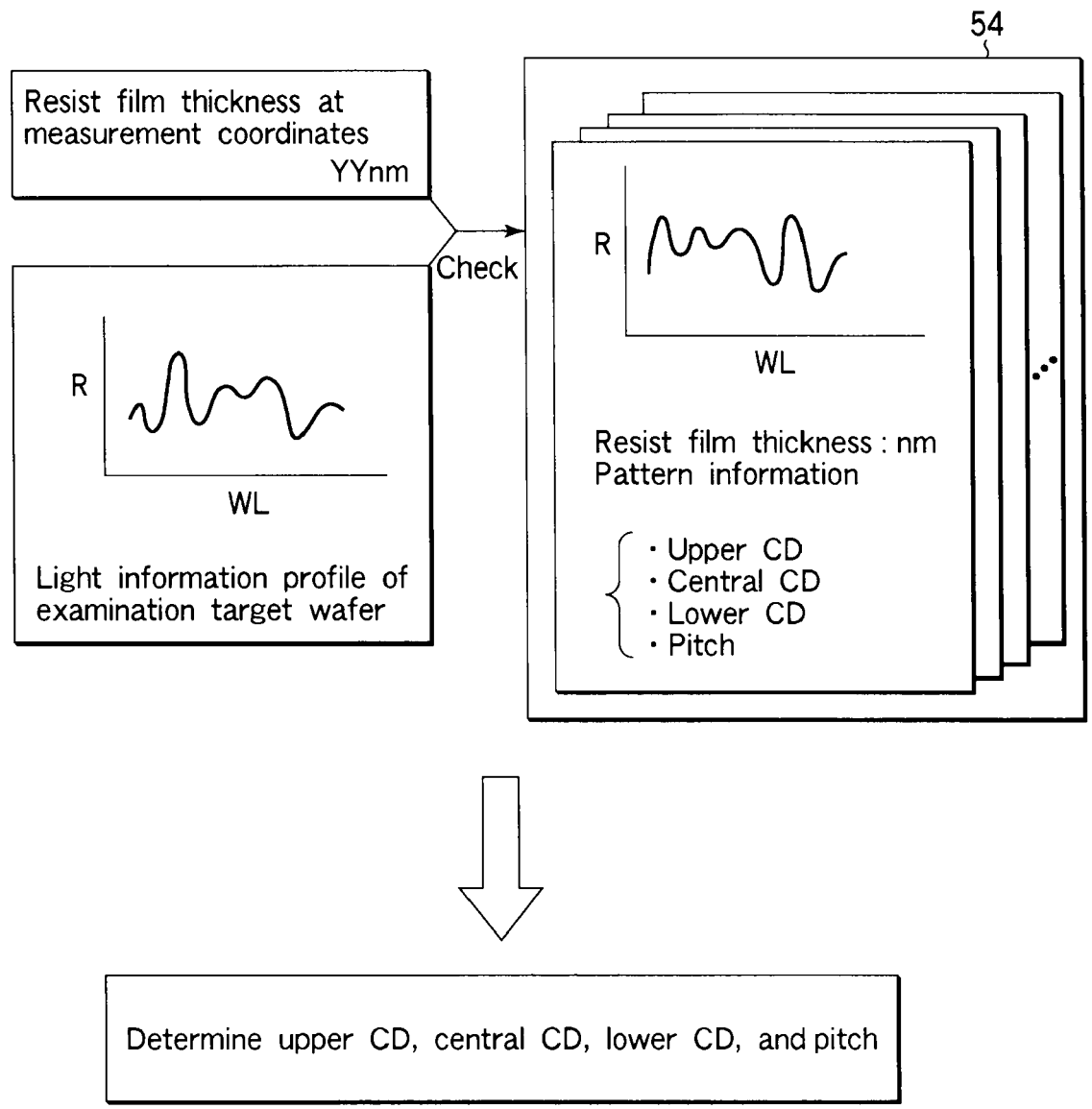
FIG. 15 is a view for explaining a manner of determining resist pattern information by the control section.

In the coating/developing apparatus having the structure described above, when a recipe is selected by a user through the input unit 70 in accordance with light exposure conditions for the light exposure apparatus C4 as well as predetermined film formation conditions, a resist film is formed in the resist film formation module 93 in accordance with the film formation conditions included in the selected recipe, and a resist film thickness distribution is determined. Then, based on the determined film thickness distribution, the resist film thickness at a light irradiation area 46 is obtained for performing an examination in the examination module 4. Then, as shown in FIG. 15, the resist film thickness and a light information profile obtained by the examination in the examination module 4 are checked against data stored in the storage section 54 of the examination module 4. Then, resist pattern information, such as the upper CD, except for the resist film thickness is obtained.

As described above, a resist film thickness distribution is determined and used to determine the resist film thickness at an irradiation area 46, and then the resist film thickness and a light information profile obtained by the examination module 4 are checked against the storage section 54. Also in this case, the pattern information is prevented from causing errors due to fluctuations of the resist film thickness, so that the pattern information is obtained with high accuracy.

As in the second embodiment, when a resist film thickness distribution is obtained as described above, the thickness distribution of a resist film formed on a wafer W may be calculated by a simulation using the resist film formation conditions, so that it is used to determine pattern information. Where a resist film thickness distribution is obtained by a simulation like this, it is preferably arranged that users can set light exposure conditions as well as film formation conditions, and the storage section of the control section 9 stores data concerning a changes in the resist film thickness distribution after development relative to a change in the light exposure conditions. In this case, when light exposure conditions are set along with film formation conditions by a user, a simulation is then performed thereon to determine a resist film thickness distribution after development, and so the pattern information is obtained with high accuracy.

In the explanation described above, only one of the anti-reflection film thickness distribution and resist film thickness distribution is determined to perform the subsequent sequence. Alternatively, the film thickness distributions of both of the anti-reflection film and resist film may be determined in accordance with their film formation conditions and used to determine the respective film thicknesses at an irradiation area 46 for the examination module 4, so that the obtained resist film thickness and anti-reflection film thickness are checked along with the light information profiles against the storage section 54. In this case, the pattern information is obtained with higher accuracy.

As explained in Description of the Related Art, the examination methods according to the first to third embodiments are effective to obtain resist pattern information on a wafer where the anti-reflection film and the resist film thickness are small. Further, a method according to the present invention may be effective to obtain resist pattern information with high accuracy on a wafer with a non-dense resist pattern, where, i.e., the recessed portions of the resist pattern is wider than the protruded portions, because the information amount of light transmitted through the resist pattern is smaller when the wafer is examined.

In the respective embodiments described above, the pattern information is not limited to the example described above. For example, the angle of the sidewall of a pattern relative to the horizontal plane may be detected along with the line width of the pattern. The storage section 54 may be connected to the bus of the control section of the coating/developing apparatus, so that the control section can determine the pattern information.

Figure 16A:
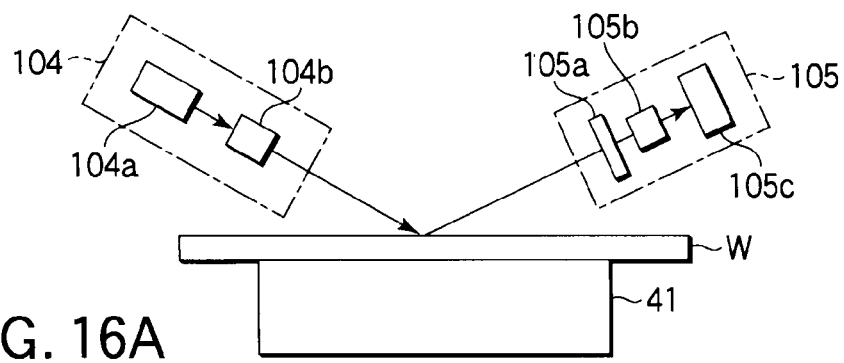
FIGS. 16A and 16B are views for explaining a manner of obtaining resist pattern information.

In the explanation described above, the light information profile comprises a reflection coefficient (R) as information included in light, but may comprise polarized light components (Δ, Ψ) in place of the reflection coefficient. In this case, the examination module 4 includes a light radiating portion 104 and a light receiving portion 105, as shown in FIG. 16A, for example. The light radiating portion 104 includes a laser light source 104a, light polarizer 104b, and so forth. The light receiving portion 105 includes a compensating plate 105a, a light analyzer 105b, a light detector 105c, and so forth. As in the embodiments described above, the stage 41 is movable, so that an irradiation area 46 to be irradiated with light from the light radiating portion 104 can be shifted to any position on the wafer W. Light reflected from the irradiation area 46 is received by the light receiving portion 105, and light information profile representing the relationship between the polarized light components (Δ, Ψ) and wavelength (WL) of the light is obtained by arithmetical operations. The polarized light components are values expressed by angle (°) which represent the phase difference and amplitude ratio between the reflected p-polarized light and s-polarized light.

Figure 16B:
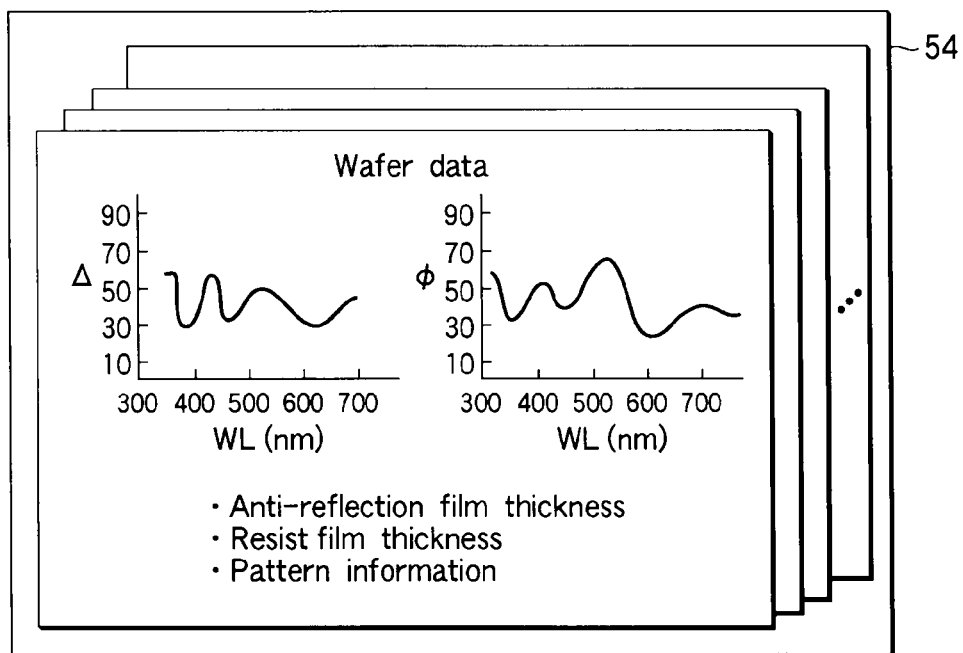
Figure 16B:
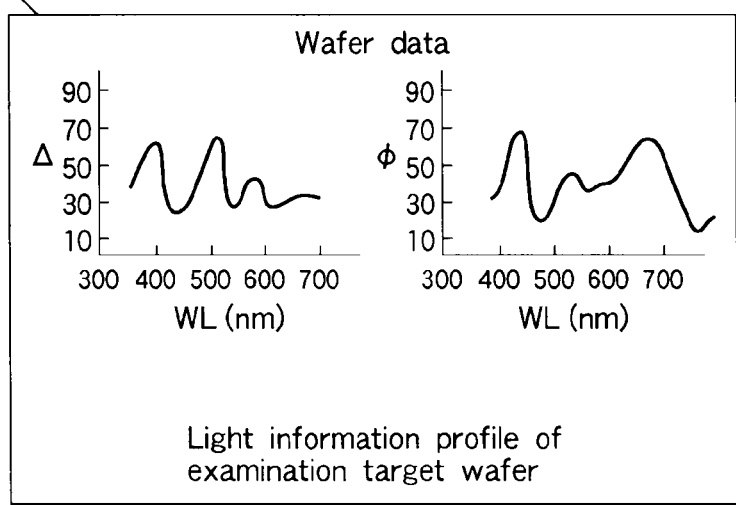

As shown in FIG. 16B, the storage section 54 of the examination module 4 may stores a lot of data of wafers comprising correlations of the light information profile, anti-reflection film thickness, resist film thickness, and resist pattern information, (i.e., data comprising correlations of different values of these factors). In this case, as in the embodiments described above, an anti-reflection film thickness determined from a film thickness distribution and polarized light components (Δ, Ψ) obtained by the light receiving portion 101 are checked against the data stored in the storage section 54, to find data that conforms or most approximates to the target in terms of both of the anti-reflection film thickness and light information profile waveform, so as to determine resist pattern information.

(Evaluation Tests)
Evaluation Tests 1:

In an evaluation test 1-1, a wafer was designed by a simulation to include a silicon film, an anti-reflection film, and resist film laminated one on top of the other in this order from below. The wafer was provided with an examination pattern having an upper CD of 30 nm, a lower CD of 70 nm, a resist film thickness of 110 nm, a pitch of 100 nm, and an anti-reflection film thickness of 75 nm. However, the anti-reflection film was preset to have errors less than about 2 nm in thickness on the surface of the wafer. Further, in this test, only a light information profile was obtained by irradiating the wafer W with light, as explained in Description of the Related Art, and was checked against the storage section 1C that stored correlations of the light information profile, anti-reflection film thickness, and pattern information, to determine resist pattern information along with an anti-reflection film thickness. In other words, this evaluation test 1-1 used the anti-reflection film thickness as a parameter. Then, the examination was repeated on respective portions set on the wafer, and the difference between the pattern information determined by the examination and the designed examination pattern described above was measured.

In an evaluation test 1-2, as explained in Description of the Related Art, the anti-reflection film thickness was fixed at a design value of 75 nm, so that a checking operation was performed against data concerning an anti-reflection film thickness of 75 nm in the storage section. Except for this matter, a wafer provided with the examination pattern described above was examined by a simulation using the same conditions as those of the evaluation test 1-1, and the difference between the pattern information determined by the examination and the designed examination pattern described above was measured.

Figure 17A:
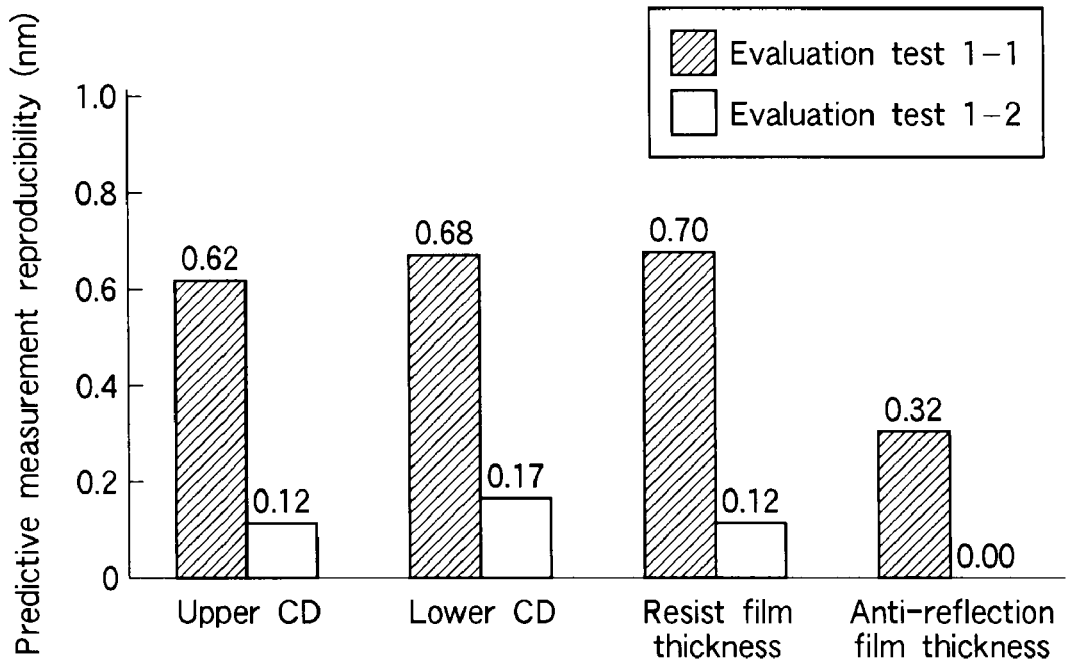
FIGS. 17A and 17B are graphs showing results of evaluation tests performed to confirm effects according to an embodiment of the present invention.

FIG. 17A shows experimental results of these tests. In this graph, the vertical axis denotes predictive measurement reproducibility (nm), which is the triple value of a standard deviation, wherein a smaller value of the predictive measurement reproducibility provides a smaller measurement error. Bars with hatching show results of the evaluation test 1-1, and bars without hatching show results of the evaluation test 1-2. As shown in this graph, in terms of the upper CD, lower CD, and resist film thickness, the predictive measurement reproducibility of the evaluation test 1-2 was less than or equal to one fourth of the predictive measurement reproducibility of the evaluation test 1-1. Accordingly, as compared with a case where only the light information profile was checked against the library or storage section to calculate the resist pattern information along with the anti-reflection film as a fluctuation value, the examination accuracy of resist pattern information was higher in a case where the anti-reflection film thickness was fixed. It is thought that, since the present invention can decrease errors because of the anti-reflection film thickness distribution, the measurement errors can be further decreased as compared with the examination method according to the evaluation test 1-2 in which the anti-reflection film thickness was fixed.

Evaluation Tests 2:
An examination pattern was designed to have an upper CD of 32 nm, a lower CD of 72 nm, a resist film thickness of 80 nm, a pitch of 64 nm, and an anti-reflection film thickness of 64 nm. Except for this matter, a simulation was performed in the same way as the evaluation tests 1-1 and 1-2. In an evaluation test 2-1, the anti-reflection film thickness was used as a parameter, as in the evaluation test 1-1. In an evaluation test 2-2, the anti-reflection film thickness was fixed at a design value of 64 nm for examination, as in the evaluation test 1-2.

Figure 17B:
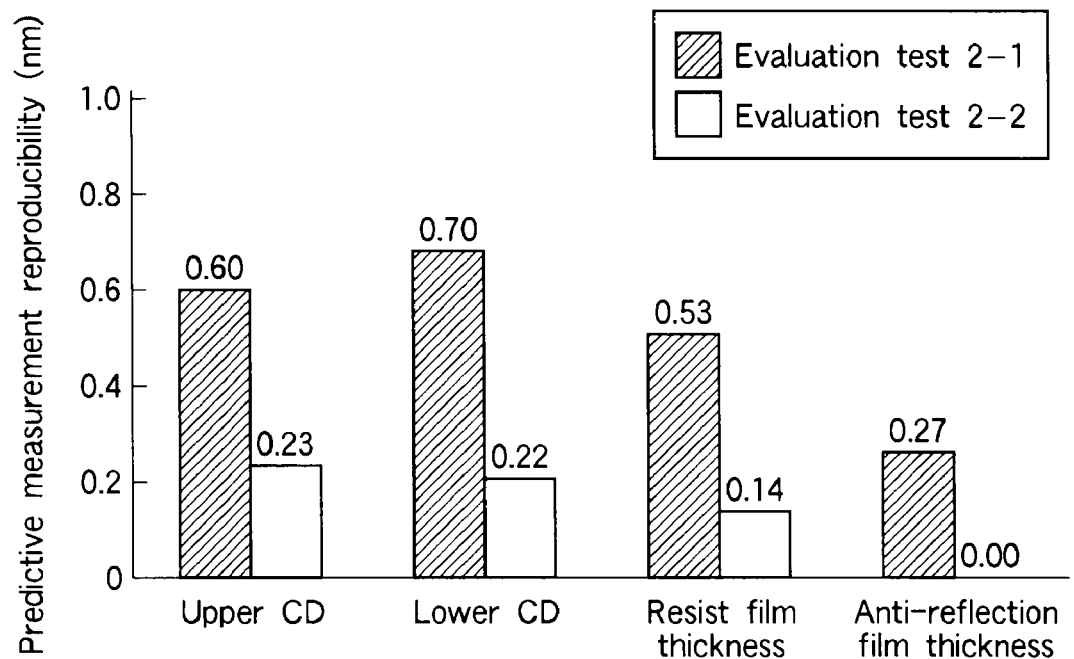

FIG. 17B shows simulation results of these tests. As shown in this graph, in terms of the respective values of resist pattern information, the predictive measurement reproducibility of the evaluation test 2-2 was less than or equal to one third of the predictive measurement reproducibility of the evaluation test 2-1. Accordingly, an effect of an embodiment of the present invention was proved, as in the evaluation tests 1. The pattern on the wafer W designed in the evaluation tests 2 was smaller than wafer resist patterns in current use. Accordingly, it is thought from these test results that the present invention allows the pattern information to be obtained with high accuracy, even where patterns are more miniaturized in the future.

Evaluation Tests 3:

An examination method according to a comparative example (evaluation test 3-1) was arranged such that an anti-reflection film was subjected to an examination using scatterometry to determine an anti-reflection film thickness, as explained in Description of the Related Art, and then a resist pattern was irradiated with light, so that resist pattern information was obtained based on a light information profile thus obtained and the determined anti-reflection film thickness. Then, the throughput of the examination method according to this comparative example (evaluation test 3-1) was compared with the throughput of an examination method according to an embodiment of the present invention (evaluation test 3-2) by a simulation. In the evaluation test 3-1, light for examination was radiated onto five points of each of the anti-reflection film and resist pattern adjacent thereto (i.e., totally ten points), so that pattern information was obtained at these five positions. In the evaluation test 3-2, light was radiated onto five points of the resist pattern, so that pattern information was obtained at these positions. The time necessary for moving from the first measurement point to the next measurement point was set at 2.8 seconds, the time necessary for loading and unloading a wafer W was set at 6.5 seconds, and the time necessary for identifying a loaded wafer W was set at 1 second.

Figure 18:
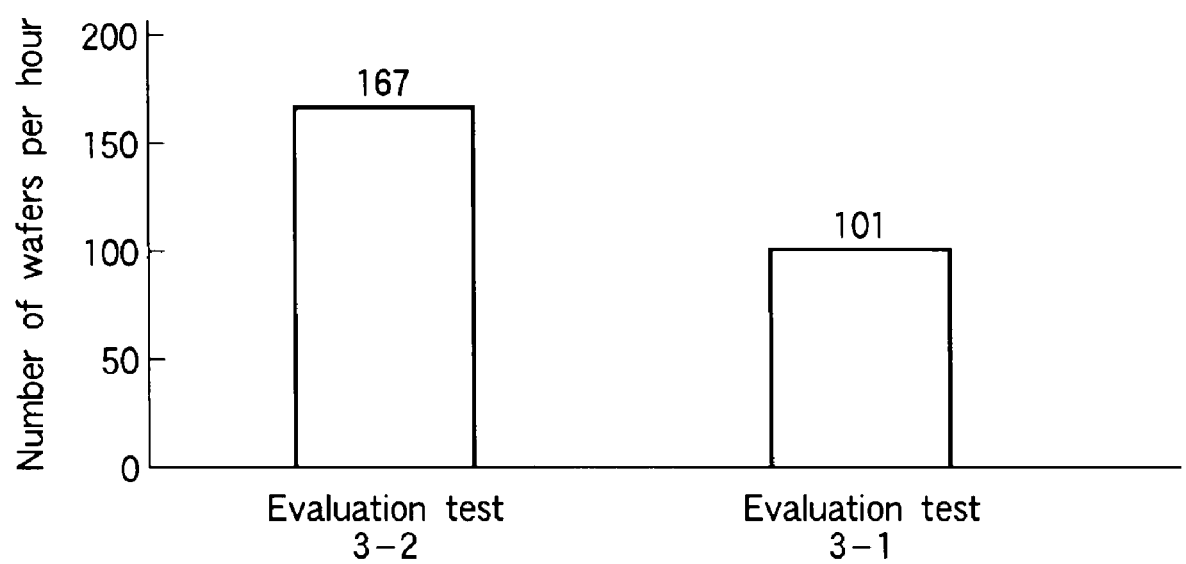
FIG. 18 is a graph showing results of evaluation tests performed to confirm effects according to an embodiment of the present invention.
Figure 19:
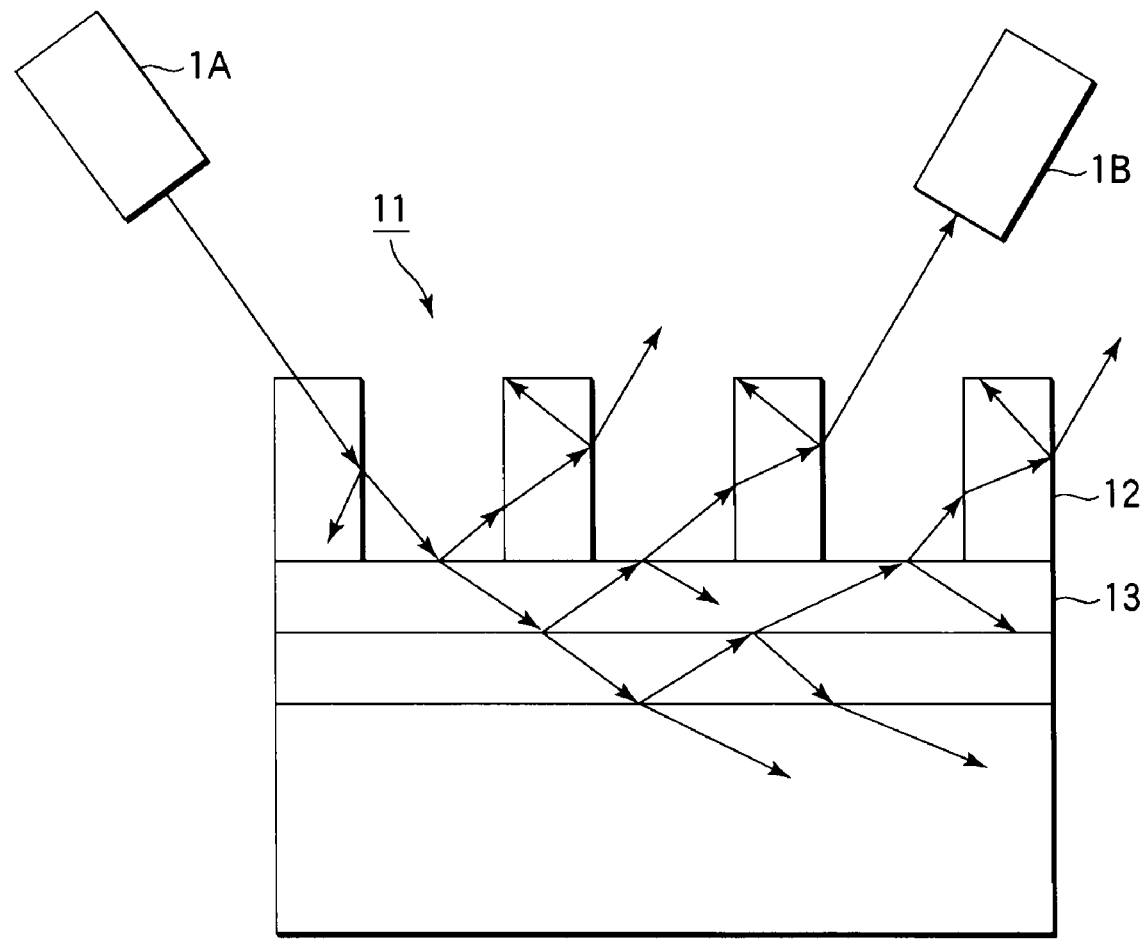
FIG. 19 is a view for explaining a manner of reflection of light radiated onto a wafer.
Figure 20:
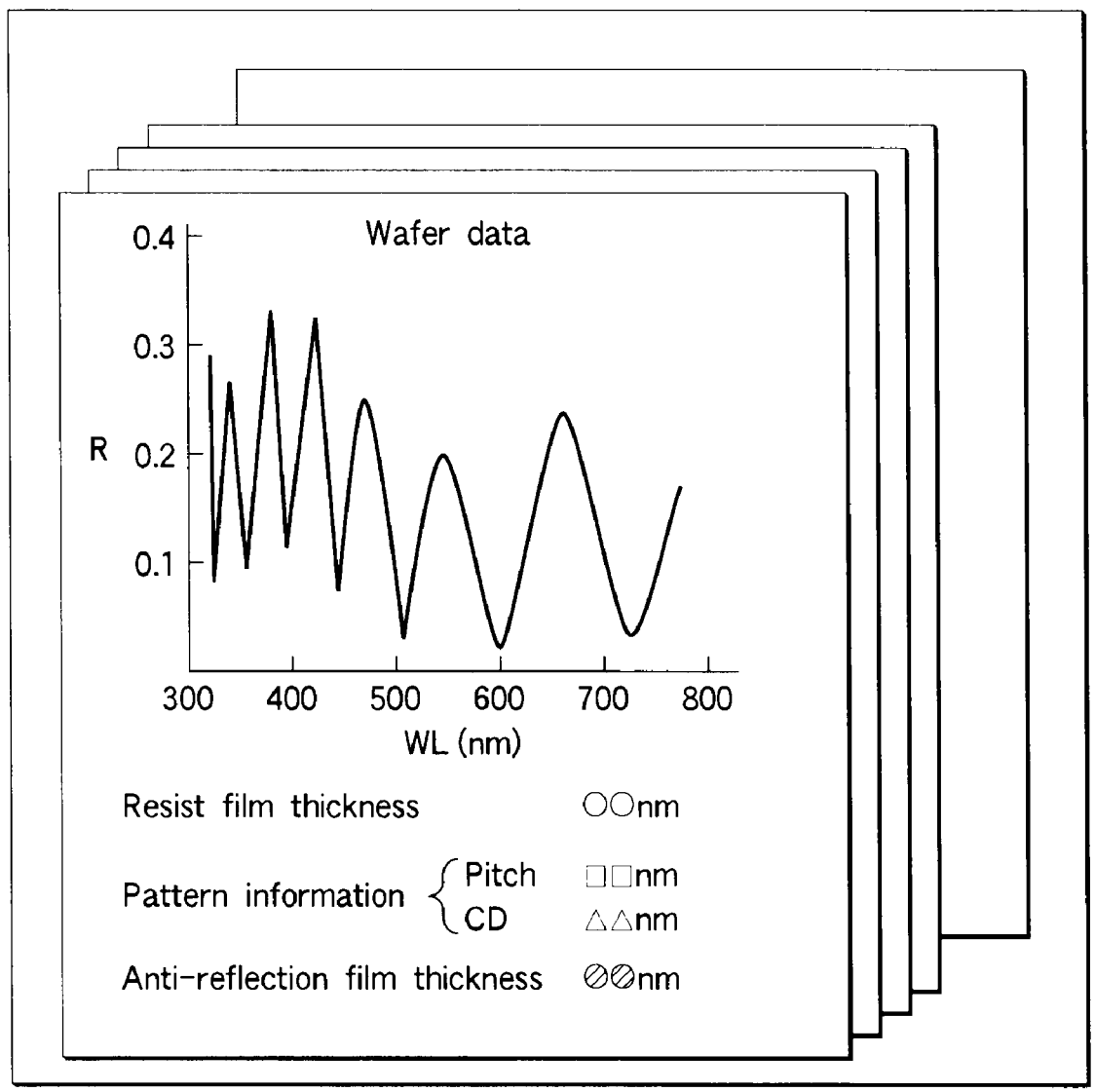
FIG. 20 is a view schematically showing an examination method using scatterometry.
Figure 20:
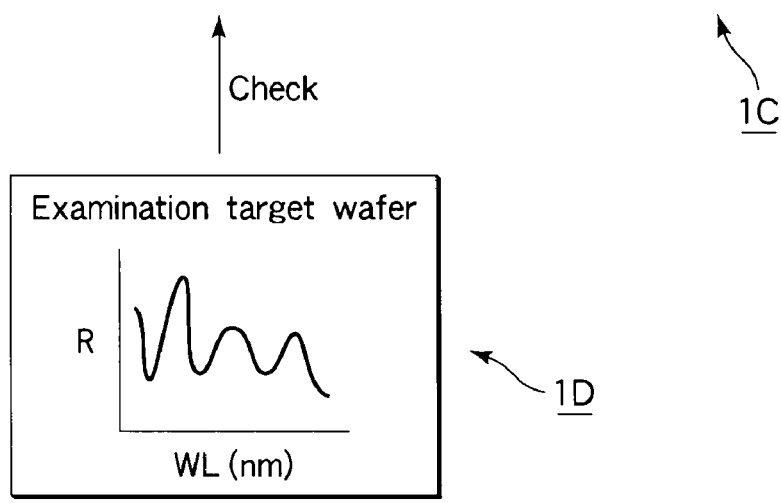
Figure 21:
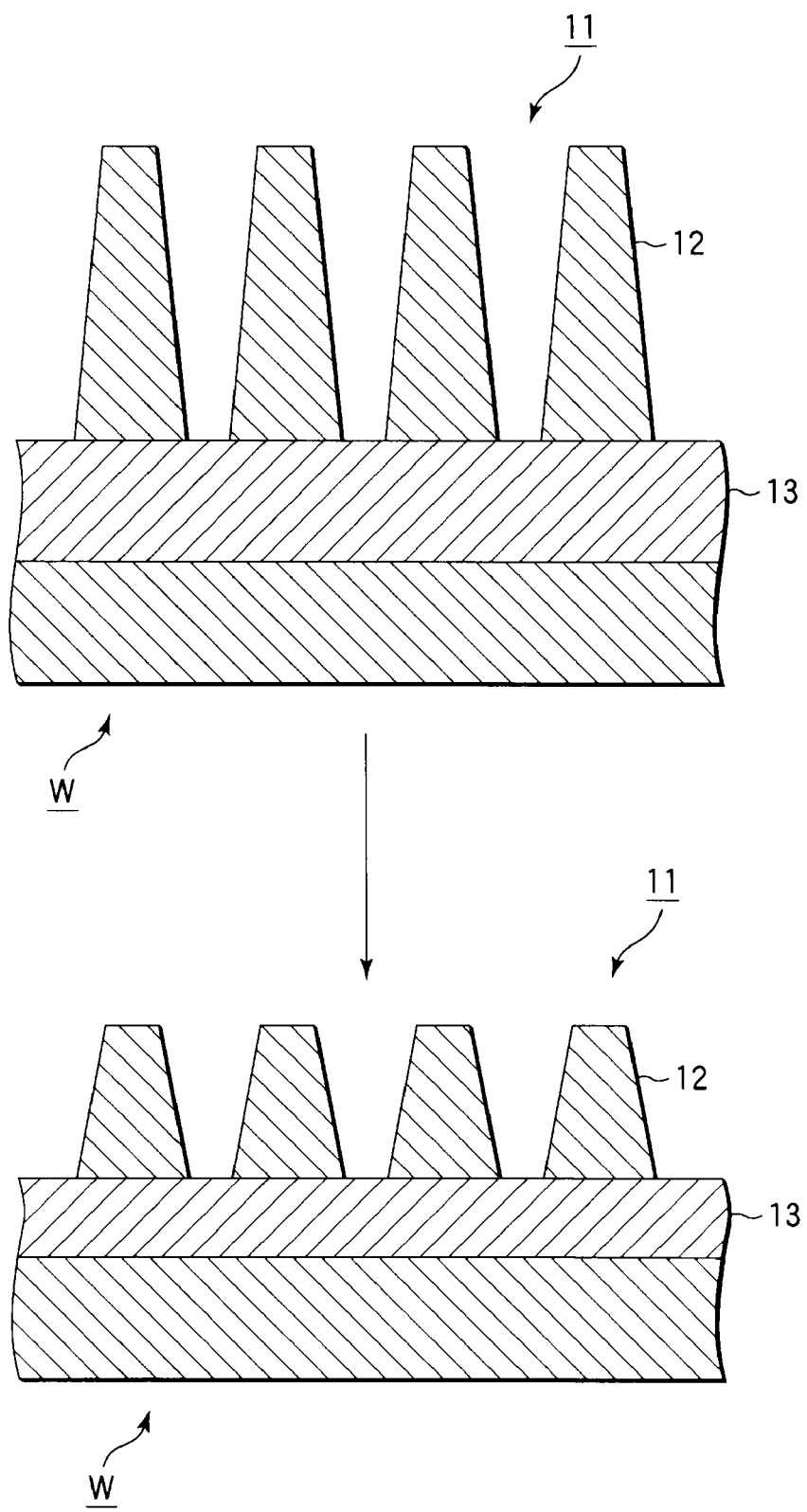
FIG. 21 is a sectional side view showing an example of a wafer with a resist film and an anti-reflection film formed thereon.

FIG. 18 shows simulation results of these tests. In this graph, the vertical axis denotes the number of wafers W examined per hour. The evaluation test 3-2 rendered 167 wafers W examined per hour, while the evaluation test 3-1 rendered 101 wafers W examined per hour, which was 61% of 167. Accordingly, it has been confirmed that the method for obtaining pattern information according to an embodiment of the present invention can provide higher throughput as compared with a method for forming resist pattern information after measuring an anti-reflection film thickness.

Evaluation Test 4:

In an evaluation test 4, a wafer was designed by a simulation to include a silicon film, an anti-reflection film, and resist film laminated one on top of the other in this order from below. The wafer was provided with an examination pattern having an upper CD of 30 nm, a lower CD of 70 nm, a resist film thickness of 110 nm, a pitch of 100 nm, and an anti-reflection film thickness of 75 nm. Then, a simulation was performed to calculate waveform data (theoretic waveform) of light information profile obtained when the wafer was irradiated with light from the light radiating portion. Then, the designed examination pattern described above was compared with resist pattern information obtained from the theoretic waveform where the anti-reflection film thickness included ±2 nm errors, i.e., the actual anti-reflection film thickness was 73 nm or 77 nm. As a result, errors were observed in all of the upper CD, lower CD, and resist film thickness. Accordingly, it has been confirmed that, if a fixed value deviated from the actual film thickness is used for the anti-reflection film thickness as described above, pattern information thereby obtained is also deviated from the actual pattern information. However, since the present invention is arranged to obtain a film thickness distribution, it is thought that the difference between the actual anti-reflection film thickness and a film thickness checked against data in the storage section can be smaller, and so the resist pattern information can be obtained with higher accuracy.

In the coating/developing apparatus according to an embodiment of the present invention, a film thickness distribution of an underlying film formed on a substrate is obtained in accordance with a process parameter used for forming the underlying film and is used to obtain an estimated film thickness of the underlying film at an light-irradiation area. Then, the estimated film thickness and a light information profile obtained at the light-irradiation area are checked against data comprising correlations of different pattern information units including at least a line width of the resist pattern, different values of a film thickness of the underlying film, and different light information profiles, to determine pattern information at the light-irradiation area. Accordingly, the difference between the underlying film thickness checked against the data and the actual underlying film thickness at the light-irradiation area is decreased, so that the pattern information can be obtained with high accuracy. Further, since the underlying film thickness does not need to be obtained by an examination, the examination time is not prolonged, whereby the throughput can be prevented from being lower.

In place of the underlying film, the thickness distribution of a resist film may be obtained and used to obtain an estimated film thickness of the resist film at a light-irradiation area. Also in this case, errors of the resist film thickness at the light-irradiation area are decreased because of the resist film thickness distribution, and so the pattern information can be obtained with high accuracy, as in the case described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating/developing apparatus for laminating a resist film on an underlying film formed on a surface of a substrate and developing the resist film treated by light exposure to form a resist pattern, the apparatus comprising:
    an underlying film formation module configured to supply a chemical liquid onto the substrate to form a coating film as the underlying film;
    a mechanism configured to obtain a film thickness distribution of the underlying film on the surface of the substrate in accordance with a process parameter used for forming the underlying film;
    a light radiating portion configured to radiate light onto the surface of the substrate with the resist pattern formed thereon;
    a light receiving portion configured to receive light reflected from the surface of the substrate;
    a mechanism configured to obtain a light information profile representing a relationship concerning the light received by the light receiving portion between its wavelength and information included therein;

a first storage section that stores data comprising correlations of different pattern information units including at least a line width of the resist pattern, different values of a film thickness of the underlying film, and different light information profiles; and a mechanism configured to use the film thickness distribution to obtain an estimated film thickness of the underlying film at a light-irradiation area on the surface of the substrate, and to check the estimated film thickness and a light information profile obtained at the light-irradiation area against the data to determine pattern information at the light-irradiation area.

2. The coating/developing apparatus according to claim 1, wherein the mechanism configured to obtain a film thickness distribution of the underlying film comprises a second storage section that stores data comprising correlations of different values of the process parameter and different film thickness distributions, and is configured to check a given value of the process parameter against the data stored in the second storage section to obtain the film thickness distribution.

3. The coating/developing apparatus according to claim 1, wherein the mechanism configured to obtain a film thickness distribution of the underlying film is configured to perform arithmetical operations using a given value of the process parameter to obtain the film thickness distribution.

4. The coating/developing apparatus according to claim 1, wherein the underlying film formation module comprises a chemical liquid nozzle configured to supply the chemical liquid onto a central portion of the substrate, and a holding member configured to hold a back side central portion of the substrate and to rotate the substrate about a vertical axis so as to spread the chemical liquid from the central portion of the substrate to a peripheral portion by a centrifugal force, and the process parameter includes a rotational speed of the substrate in performing supply of the chemical liquid from the chemical liquid nozzle and a rotational speed of the substrate for drying the chemical liquid after the supply of the chemical liquid is stopped.

5. The coating/developing apparatus according to claim 1, wherein the underlying film comprises an anti-reflection film.

6. The coating/developing apparatus according to claim 1, wherein the light information profile comprises a relationship between a light wavelength and a reflection coefficient or polarized light component.

7. A coating/developing apparatus for laminating a resist on a surface of a substrate and developing the resist film treated by light exposure to form a resist pattern, the apparatus comprising:

a resist film formation module configured to supply a resist onto the substrate to form a coating film as the resist film;

a mechanism configured to obtain a film thickness distribution of the resist film on the surface of the substrate in accordance with a process parameter used for forming the resist film;

a light radiating portion configured to radiate light onto the surface of the substrate with the resist pattern formed thereon;

a light receiving portion configured to receive light reflected from the surface of the substrate;

a mechanism configured to obtain a light information profile representing a relationship concerning the light received by the light receiving portion between its wavelength and information included therein;

a first storage section that stores data comprising different pattern information units including at least a line width of the resist pattern, different values of a film thickness of the resist film, and different light information profiles; and a mechanism configured to use the film thickness distribution to obtain an estimated film thickness of the resist film at a light-irradiation area on the surface of the substrate, and to check the estimated film thickness and a light information profile obtained at the light-irradiation area against the data to determine pattern information at the light-irradiation area.

8. The coating/developing apparatus according to claim 7, wherein the mechanism configured to obtain a film thickness distribution of the resist film comprises a second storage section that stores data comprising correlations of different values of the process parameter and different film thickness distributions, and is configured to check a given value of the process parameter against the data stored in the second storage section to obtain the film thickness distribution.

9. The coating/developing apparatus according to claim 7, wherein the mechanism configured to obtain a film thickness distribution of the resist film is configured to perform arithmetical operations using a given value of the process parameter to obtain the film thickness distribution.

10. The coating/developing apparatus according to claim 7, wherein the film thickness distribution of the resist film comprises a film thickness distribution of the resist film after a developing process is performed thereon.

11. The coating/developing apparatus according to claim 7, wherein the light information profile comprises a relationship between a light wavelength and a reflection coefficient or polarized light component.

12. A coating/developing method for laminating a resist film on an underlying film formed on a surface of a substrate and developing the resist film treated by light exposure to form a resist pattern, the method comprising:

supplying a chemical liquid onto the substrate to form a coating film as the underlying film;

obtaining a film thickness distribution of the underlying film on the surface of the substrate in accordance with a process parameter used for forming the underlying film;

radiating light onto the surface of the substrate with the resist pattern formed thereon;

receiving light reflected from the surface of the substrate;

obtaining a light information profile representing a relationship concerning the light thus received between its wavelength and information included therein;

using the film thickness distribution to obtain an estimated film thickness of the underlying film at a light-irradiation area on the surface of the substrate; and checking the estimated film thickness and a light information profile obtained at the light-irradiation area against data comprising correlations of different pattern information units including at least a line width of the resist pattern, different values of a film thickness of the underlying film, and different light information profiles, to determine pattern information at the light-irradiation area.

13. The coating/developing method according to claim 12, wherein said obtaining a film thickness distribution of the underlying film comprises checking a given value of the process parameter against data comprising correlations of different values of the process parameter and different film thickness distributions.

14. The coating/developing method according to claim 12, wherein said obtaining a film thickness distribution of the underlying film comprises performing arithmetical operations using a given value of the process parameter to obtain the film thickness distribution.

15. A coating/developing method for laminating a resist film on a surface of a substrate and developing the resist film treated by light exposure to form a resist pattern, the method comprising:
supplying a resist onto the substrate to form a coating film as the resist film;
obtaining a film thickness distribution of the resist film on the surface of the substrate in accordance with a process parameter used for forming the resist film;
radiating light onto the surface of the substrate with the resist pattern formed thereon;
receiving light reflected from the surface of the substrate;
obtaining a light information profile representing a relationship concerning the light thus received between its wavelength and information included therein;
using the film thickness distribution to obtain an estimated film thickness of the resist film at a light-irradiation area on the surface of the substrate; and
checking the estimated film thickness and a light information profile obtained at the light-irradiation area against data comprising correlations of different pattern information units including at least a line width of the resist pattern, different values of a film thickness of the resist film, and different light information profiles, to determine pattern information at the light-irradiation area.

16. The coating/developing method according to claim 15, wherein said obtaining a film thickness distribution of the resist film comprises checking a given value of the process parameter against data comprising correlations of different values of the process parameter and different film thickness distributions.

17. The coating/developing method according to claim 15, wherein said obtaining a film thickness distribution of the resist film comprises performing arithmetical operations using a given value of the process parameter to obtain the film thickness distribution.

18. A computer readable non-transitory medium containing program instructions for execution on a processor for performing the coating/developing method according to claim 12, wherein the program instructions, when executed by the processor, cause a coating/developing apparatus to perform the coating/developing method according to claim 12.

19. A computer readable non-transitory medium containing program instructions for execution on a processor for performing the coating/developing method according to claim 15, wherein the program instructions, when executed by the processor, cause a coating/developing apparatus to perform the coating/developing method according to claim 15.

* * * * *